(12) United States Patent
Seo et al.

(10) Patent No.: US 10,991,677 B2
(45) Date of Patent: Apr. 27, 2021

(54) SEMICONDUCTOR PACKAGE

(71) Applicant: Samsung Electronics Co., Ltd., Suwon-si (KR)

(72) Inventors: Sun-kyoung Seo, Yongin-si (KR); Cha-jea Jo, Yongin-si (KR); Soo-hyun Ha, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/847,987

(22) Filed: Apr. 14, 2020

(65) Prior Publication Data

US 2020/0243488 A1 Jul. 30, 2020

Related U.S. Application Data

(63) Continuation of application No. 16/448,703, filed on Jun. 21, 2019, now Pat. No. 10,658,341, which is a
(Continued)

(30) Foreign Application Priority Data

May 17, 2016 (KR) ........................ 10-2016-0060362

(51) Int. Cl.
*H01L 25/065* (2006.01)
*H01L 23/31* (2006.01)
*H01L 23/532* (2006.01)

(52) U.S. Cl.
CPC ...... *H01L 25/0657* (2013.01); *H01L 23/3185* (2013.01); *H01L 23/53238* (2013.01);
(Continued)

(58) Field of Classification Search
CPC .......... H01L 25/0657; H01L 23/53238; H01L 23/3185
(Continued)

(56) References Cited

U.S. PATENT DOCUMENTS 6,335,491 B1   1/2002   Alagaratnam et al.
7,276,799 B2  10/2007   Lee et al.
(Continued)

FOREIGN PATENT DOCUMENTS

CN   102214627 A   10/2011
CN   103855118 A    6/2014
(Continued)

OTHER PUBLICATIONS

U.S. Notice of Allowance dated Aug. 12, 2020 issued in co-pending U.S. Appl. No. 16/881,767.
(Continued)

*Primary Examiner* — Andy Huynh
(74) *Attorney, Agent, or Firm* — Harness, Dickey & Pierce, P.L.C.

(57) ABSTRACT

A semiconductor package includes: a first semiconductor chip in which a through-electrode is provided; a second semiconductor chip connected to a top surface of the first semiconductor chip; a first connection bump attached to a bottom surface of the first semiconductor chip and including a first pillar structure and a first solder layer, and a second connection hump located between the first semiconductor chip and the second semiconductor chip, configured to electrically connect the first semiconductor chip and the second semiconductor chip, and including a second pillar structure and a second solder layer.

20 Claims, 24 Drawing Sheets

Related U.S. Application Data continuation of application No. 16/114,795, filed on Aug. 28, 2018, now Pat. No. 10,373,935, which is a continuation of application No. 15/421,386, filed on Jan. 31, 2017, now Pat. No. 10,083,939.

(52) U.S. Cl.
CPC ............... *H01L 2224/16145* (2013.01); *H01L 2224/73204* (2013.01); *H01L 2224/94* (2013.01); *H01L 2225/06513* (2013.01); *H01L 2225/06517* (2013.01); *H01L 2225/06544* (2013.01); *H01L 2225/06582* (2013.01)

(58) Field of Classification Search
USPC ........................................................ 257/737
See application file for complete search history.

(56) References Cited

U.S. PATENT DOCUMENTS

| | | |
|---|---|---|
| 7,537,959 B2 | 5/2009 | Lee et al. |
| 7,576,433 B2 | 8/2009 | Ishino et al. |
| 7,893,540 B2 | 2/2011 | Ishino et al. |
| 7,977,156 B2 | 7/2011 | Lee et al. |
| 8,298,940 B2 | 10/2012 | Ishino et al. |
| 8,368,195 B2 | 2/2013 | Tanie et al. |
| 8,368,231 B2 | 2/2013 | Lee et al. |
| 8,513,121 B2 | 8/2013 | Ishino et al. |
| 8,686,560 B2 | 4/2014 | Parvarandeh et al. |
| 9,230,897 B2 | 1/2016 | Kim |
| 9,343,360 B2 | 5/2016 | Obu et al. |
| 2005/0287706 A1 | 12/2005 | Fuller et al. |
| 2011/0068427 A1 | 3/2011 | Paek et al. |
| 2013/0087917 A1 | 4/2013 | Jee et al. |
| 2014/0131886 A1 | 5/2014 | Paek et al. |
| 2014/0167254 A1 | 6/2014 | Yu et al. |
| 2015/0048499 A1 | 2/2015 | Tai et al. |
| 2015/0130078 A1 | 5/2015 | Hong et al. |
| 2015/0192633 A1 | 7/2015 | Garibay et al. |
| 2015/0325551 A1 | 11/2015 | Wen et al. |
| 2015/0357318 A1 | 12/2015 | Chen et al. |
| 2016/0020184 A1 | 1/2016 | Park et al. |

FOREIGN PATENT DOCUMENTS

| | | |
|---|---|---|
| CN | 103872000 A | 6/2014 |
| JP | 4507101 B2 | 7/2010 |
| KR | 10-0537892 B1 | 12/2005 |
| KR | 10-2008-0036345 A | 4/2008 |
| KR | 10-1099587 B1 | 12/2011 |

OTHER PUBLICATIONS

U.S. Office Action dated Jul. 2, 2020 issued in co-pending U.S. Appl. No. 16/881,767.
Chinese Office Action dated Dec. 1, 2020 issued in corresponding Chinese Patent Application No. 201710333226.7.
Taiwanese Office Action dated Mar. 17, 2021 issued in corresponding Taiwanese Patent Application No. 106115128. English translation has been provided.

SEMICONDUCTOR PACKAGE

CROSS-REFERENCE TO RELATED APPLICATION

This application is a continuation of U.S. application Ser. No. 16/448,703, filed on Jun. 21, 2019, which is a continuation application of U.S. application Ser. No. 16/114,795 filed on Aug. 28, 2018, now U.S. Pat. No. 10,373,935, issued on Aug. 6, 2019, which is a continuation of U.S. application Ser. No. 15/421,386, filed Jan. 31, 2017, now U.S. Pat. No. 10,083,939, issued on Sep. 25, 2018, which claims the benefit of Korean Patent Application No. 10-2016-0060362, filed on May 17, 2016, in the Korean Intellectual Property Office, the disclosure of each of which is incorporated herein in its entirety by reference.

BACKGROUND

The inventive concept relates to a semiconductor package, and more particularly, to a semiconductor package including a through-substrate via (TSV) structure.

As the electronic industry has grown rapidly and user demands have increased, electronic devices have become smaller and lighter. Accordingly, smaller and lighter semiconductor packages having high performance and a large storage capacity are needed in electronic devices. For semiconductor packages to be small and light and to have high performance and a large storage capacity, semiconductor chips that have a TSV structure and semiconductor packages that include the such semiconductor chips are needed.

SUMMARY

The inventive concept provides a semiconductor package that is small and light and has high performance and large storage capacity and a method of manufacturing the semiconductor package.

According to an aspect of the inventive concept, there is provided a semiconductor package including: a first semiconductor chip in which a through-electrode is provided; a second semiconductor chip connected to a top surface of the first semiconductor chip; a first connection bump attached to a bottom surface of the first semiconductor chip and including a first pillar structure and a first solder layer; and a second connection bump located between the first semiconductor chip and the second semiconductor chip, configured to electrically connect the first semiconductor chip and the second semiconductor chip, and including a second pillar structure and a second solder layer, wherein the first pillar structure includes a material that is different from a material of the second pillar structure.

According to another aspect of the inventive concept, there is provided a semiconductor package including: a substrate; a first semiconductor chip mounted on a top surface of the substrate and including a through-electrode provided therein; a second semiconductor chip mounted on a top surface of the first semiconductor chip; a first connection bump located between the first semiconductor chip and the substrate and including a first pillar structure and a first solder layer; and a second connection bump located between the first semiconductor chip and the second semiconductor chip and including a second pillar structure and a second solder layer, wherein the first pillar structure includes a material that is different from a material of the second pillar structure.

According to another aspect of the inventive concept, there is provided a semiconductor package including: a substrate; at least two semiconductor chips mounted on a top surface of the substrate and stacked in a first direction that is perpendicular to the top surface of the substrate; an inter-chips connection bump located between the at least two semiconductor chips and configured to electrically connect two adjacent semiconductor chips from among the at least two semiconductor chips; a chip-substrate connection bump located between the substrate and a semiconductor chip that is the closest to the substrate from among the at least two semiconductor chips and having a stacked structure that is different from a stacked structure of the inter-chips connection bump; and an external connection terminal mounted on a bottom surface of the substrate, wherein a width of the external connection terminal in a second direction that is parallel to the top surface of the substrate is greater than a width of the inter-chips connection bump or the chip-substrate connection bump.

According to an aspect of the inventive concept, a method to form a semiconductor package comprises: forming a through-electrode through a semiconductor substrate; forming a first connection pad on a first surface of the through-electrode; forming a first connection bump on the first connection pad, the first connection bump having a first pillar structure that comprises a first material having a first Young's modulus; forming a first upper connection pad on a second surface of the through-electrode, the second surface opposite to the first surface; forming a second connection bump on the first upper connection pad, the second connection bump having a second pillar structure that comprises a second material, wherein the first material that is different from the second material.

BRIEF DESCRIMION OF THE DRAWINGS

Embodiments of the inventive concept will be more clearly understood from the following detailed description taken in conjunction with the accompanying drawings in which.

DETAILED DESCRIPTION OF THE EMBODIMENTS

The inventive concept will now be described more fully regarding the accompanying drawings, in which some embodiments of the inventive concept are shown.

Figure 1A:
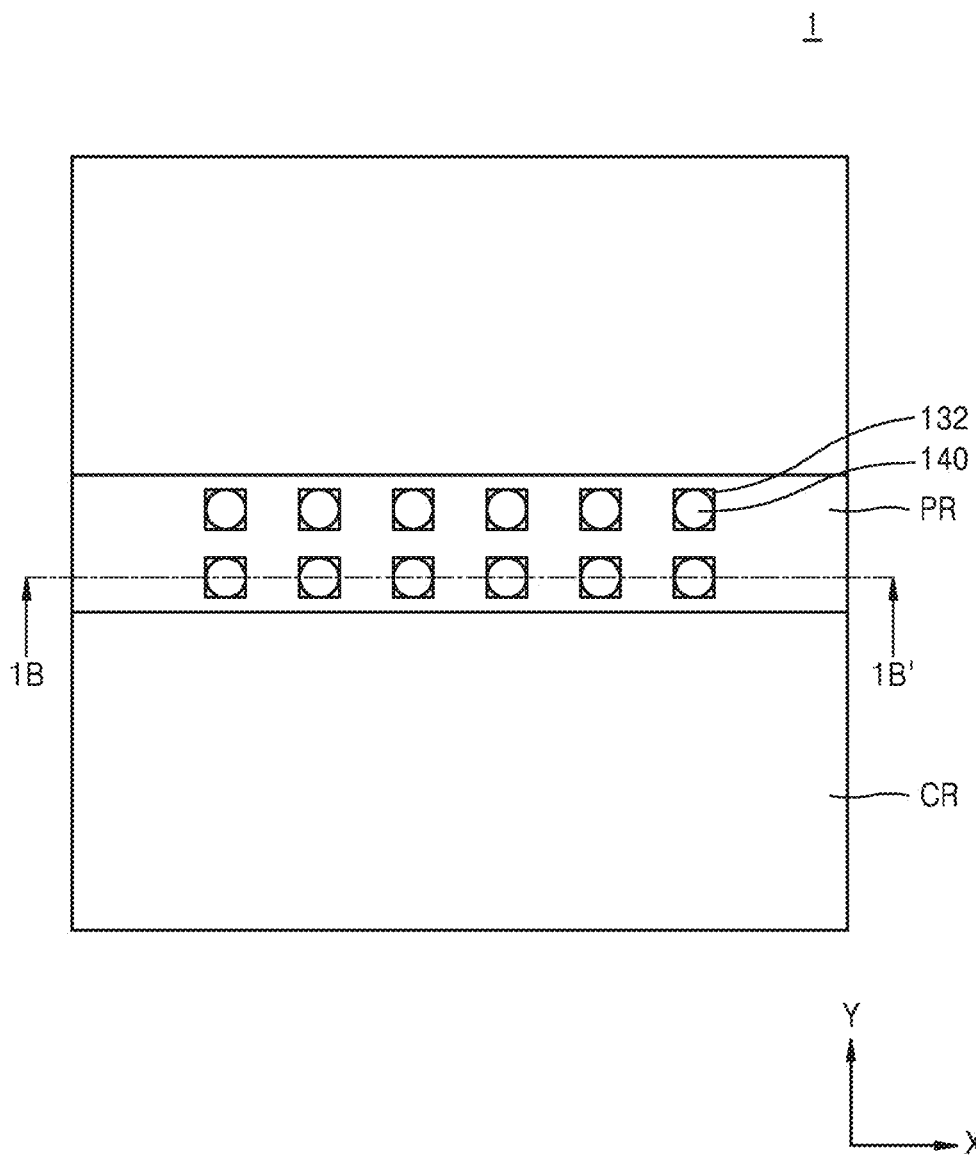
FIG. 1A is a plan view of a semiconductor package according to some embodiments.
Figure 1B:
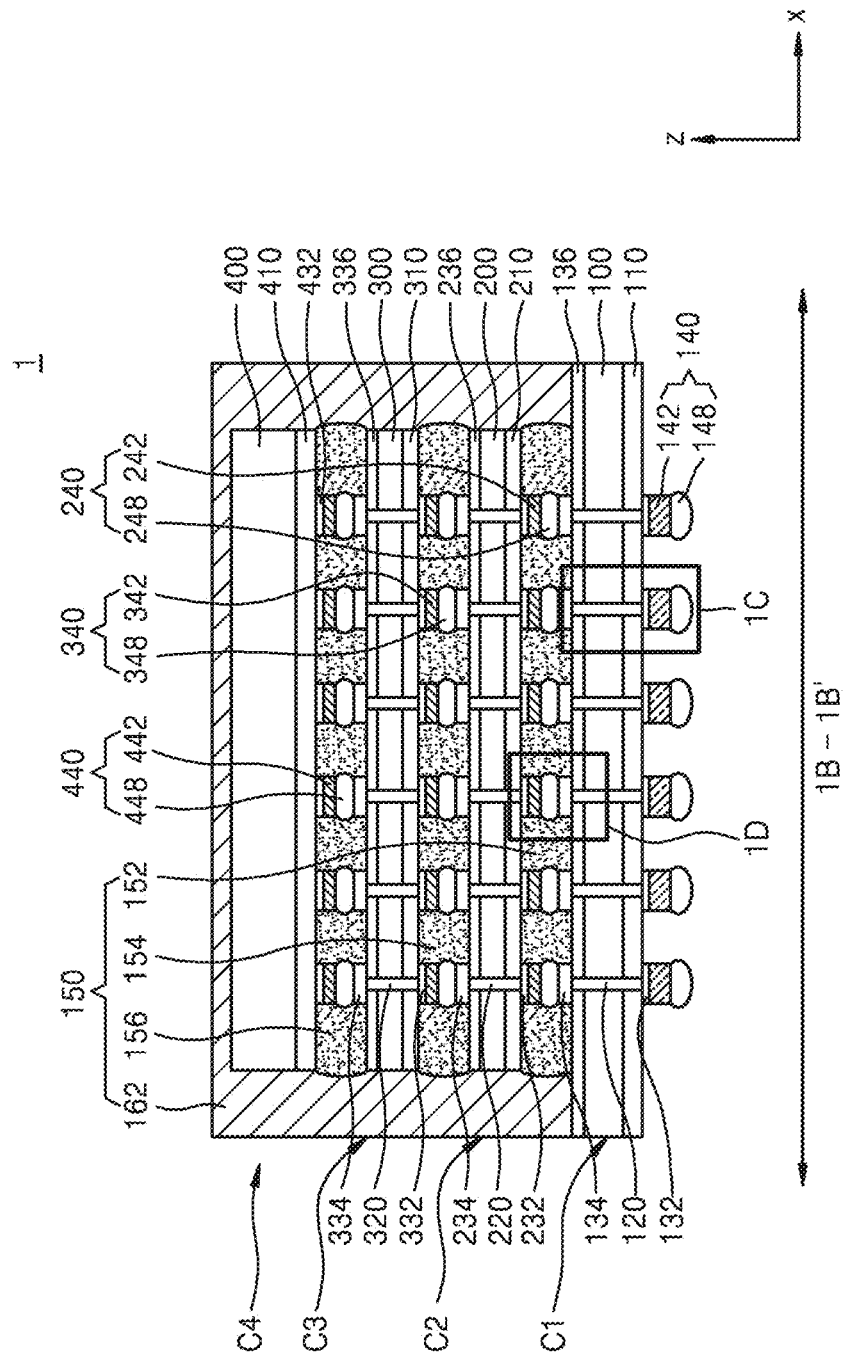
FIG. 1B is a cross-sectional view taken along line 1B-1B' of FIG. 1A.
Figure 1C:
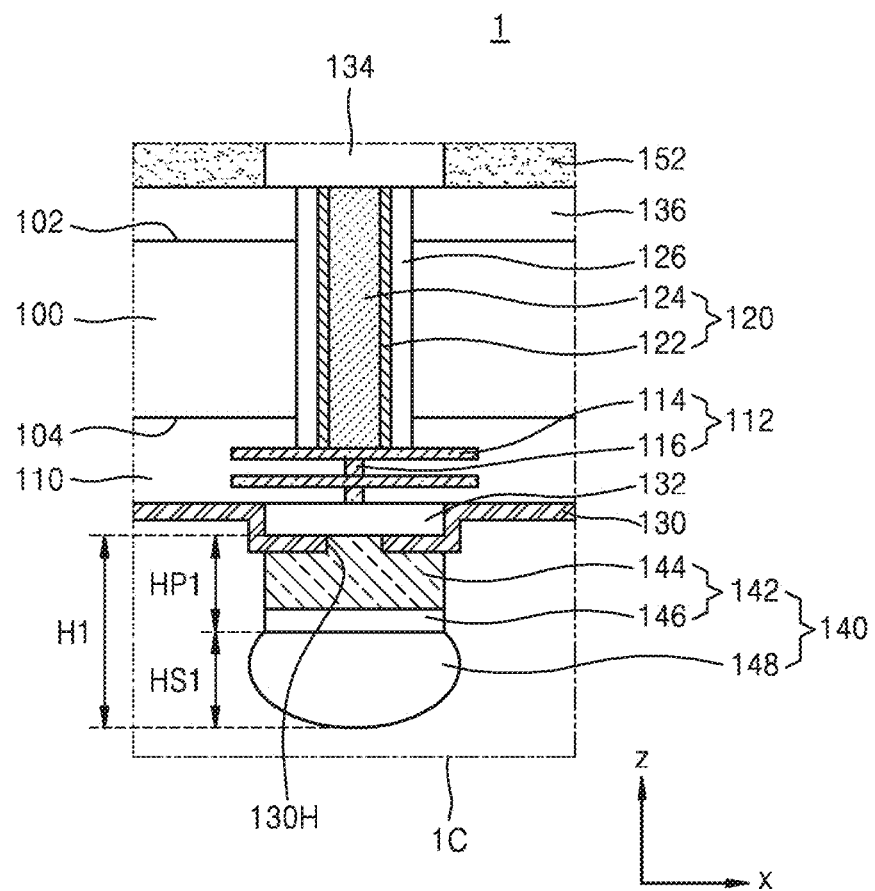
FIG. 1C is an enlarged view illustrating a portion 1C of FIG. 1B.
Figure 1D:
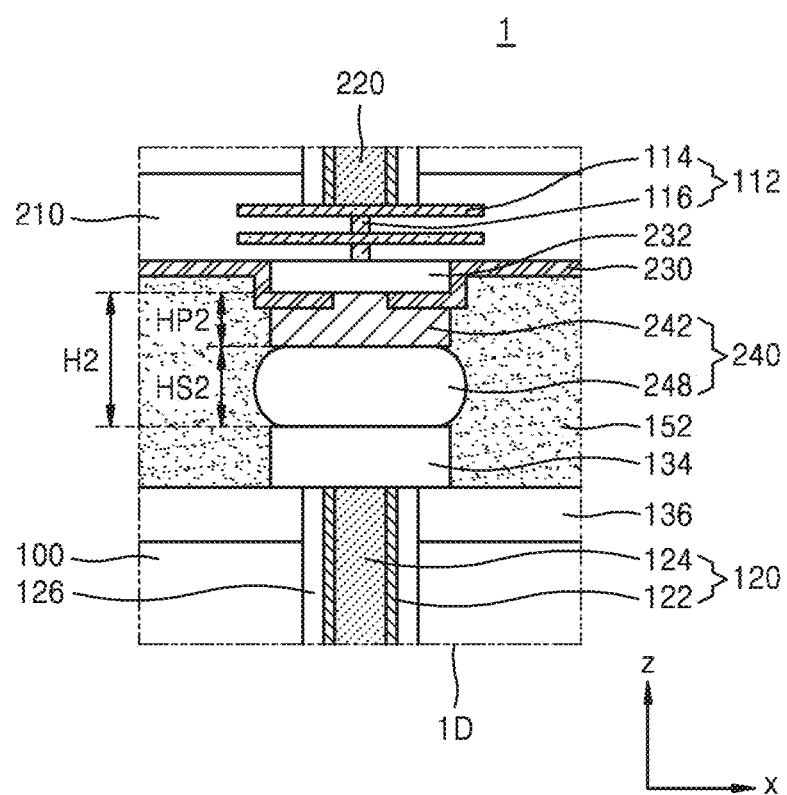
FIG. 1D is an enlarged view illustrating a portion 1D of FIG. 1B.

FIG. 1A is a plan view of a semiconductor package 1 according w some embodiments. FIG. 1B is a cross-sectional view taken along line 1B-1B' of FIG. 1A. FIG. 1C is an enlarged view illustrating a portion 1C of FIG. 1B. FIG. 1D is an enlarged view illustrating a portion 1D of FIG. 1B.

Referring to FIGS. 1A through 1D, the semiconductor package 1 may include a first semiconductor chip C1, a second semiconductor chip C2, a third semiconductor chip C3, and a fourth semiconductor chip C4 that are stacked in a first direction (e.g., a vertical direction, a Z-direction of FIG. 1B).

The semiconductor package 1 may include a cell region CR and a pad region PR. The pad region PR may be a region where first through third through-electrodes 120, 220, and 320, first through fourth connection pads 132, 232, 332, and 432, and first through fourth connection bumps 140, 240, 340, and 440 for electrically connecting the first through fourth semiconductor chips C1, C2, C3, and C4 are formed. FIG. 1A illustrates a bottom surface of the semiconductor package 1, that is, a bottom surface of the first semiconductor chip C1 through which the first connection pad 132 and the first connection bump 140 are exposed. NOM A plurality of the first connection pads 132 may be arranged in any of various layouts in an X-direction and a Y-direction in the pad region PR. For example, as shown in FIG. 1A, the first connection pads 132 may be arranged in a matrix with a predetermined pitch in the X-direction and the Y-direction in the pad region PR. For example, each of the first connection pads 132 may have a square shape, and a length of each side of the square shape may range from about 20 μm to about 40 μm. However, a shape and an arrangement of the first connection pads 132 are not limited thereto. Also, although six first connection pads 132 are arranged in the X-direction in the pad region PR and two first connection pads 132 are arranged in the Y-direction in the pad region PR for convenience of explanation, the number of the first connection pads 132 is not limited to that shown in FIG. 1A. Additionally, although the pad region PR is depicted in FIG. 1A as being located generally in a central region of the semiconductor package 1, it should be understood that the pad region PR may be located along a periphery edge of the semiconductor package 1. Moreover, it should be understood that the semiconductor package 1 may have multiple pad regions PR.

The first through fourth semiconductor chips C1, C2, C3, and C4 may be, for example, memory semiconductor chips. The memory semiconductor chips may be volatile memory semiconductor chips such as dynamic random-access memories (DRAMs) or static random-access memories (SRAMs) or non-volatile memory semiconductor chips such as phase-change random-access memories (PRAMs), magnetoresistive random-access memories (MRAMs), ferroelectric random-access memories (FeRAMs), or resistive random-access memories (RRAMs). In an embodiment, the first through fourth semiconductor chips C1, C2, C3, and C4 may be high-bandwidth memory (I-IBM) DRAMs.

Although the semiconductor package 1 in which the first through fourth semiconductor chips C1, C2, C3, and C4 are stacked is illustrated in FIGS. 1A through 1D, the number of semiconductor chips stacked in the semiconductor package 1 is not limited thereto. For example, 2 through 32 semiconductor chips may be stacked in the semiconductor package 1.

The first connection bump 140 may be disposed on the bottom surface of the first semiconductor chip C1. The second semiconductor chip C2 may be mounted on a top surface of the first semiconductor chip C1, and the second connection bump 240 may be disposed between the second semiconductor chip C2 and the first semiconductor chip C1 and may electrically connect the second semiconductor chip C2 and the first semiconductor chip C1. The third semiconductor chip C3 may be mounted on the second semiconductor chip C2 and may be electrically connected to the second semiconductor chip C2 by the third connection bump 340. Also, the fourth semiconductor chip C4 may be mounted on the third semiconductor chip C3 and may be electrically connected to the third semiconductor chip C3 by the fourth connection bump 440. The first connection bump 140 may have a structure that is different from those of the second through fourth connection bumps 240, 340, and 440. In some embodiments, the second through fourth connection bumps 240, 340, and 440 may have substantially the same structure.

The first semiconductor chip C1 may include a first semiconductor substrate 100, a first semiconductor device layer 110, the first through-electrode 120, and the first connection pad 132. As shown in FIG. 1C, the first semiconductor substrate 100 may have a top surface 102 and a bottom surface 104 that are opposite to each other, and the first semiconductor device layer 110 may be formed on the bottom surface 104 of the first semiconductor substrate 100. The first through-electrode 120 may pass through the first semiconductor substrate 100, may extend from the top surface 102 to the bottom surface 104 of the first semiconductor substrate 100, and may extend into the first semiconductor device layer 110. The first connection pad 132 may be formed on the bottom surface 104 of the first semiconductor substrate 100 with the first semiconductor device layer 110 therebetween and may be electrically connected to the first through-electrode 120.

For convenience of explanation, a surface of the first semiconductor substrate 100 that is close to the second semiconductor chip C2 is referred to as the top surface 102 and a surface of the first semiconductor substrate 100 that is close to the first connection bump 140 is referred to as the bottom surface 104. However, the following may be explained on the assumption that the semiconductor package 1 is reversed so that the top surface 102 of the first semiconductor substrate 100 faces downward and the bottom surface 104 of the first semiconductor substrate 100 faces upward. For example, the first connection pad 132 may be formed on the first semiconductor device layer 110, and in this case, it may mean that the first semiconductor device layer 110 and the first connection pad 132 are sequentially formed in an order in which the first semiconductor device layer 110 and the first connection pad 132 are positioned distally from the bottom surface 104 of the first semiconductor substrate 100.

The first semiconductor substrate 100 may include, for example, silicon (Si). Alternatively, the first semiconductor substrate 100 may include a semiconductor element such as germanium (Ge) or a compound semiconductor such as silicon carbide (SiC), gallium arsenide (GaAs), indium arsenide (InAs), or indium phosphide (InP). Alternatively, the first semiconductor substrate WO may have a silicon-on-insulator (SOI) structure. For example, the first semiconductor substrate 100 may include a buried oxide (BOX) layer. The first semiconductor substrate 100 may include a conductive region, for example, a well doped with impurities or a structure doped with impurities. Also, the first semiconductor substrate 100 may have any of various device isolation structures such as a shallow trench isolation (STI) structure.

The first semiconductor device layer 110 may include a variety of individual devices and an insulating interlayer (not shown). The plurality of individual devices may include various microelectronic devices, for example, a metal-oxide-semiconductor field effect transistor (MOSFET) such as a complementary metal-insulator-semiconductor (CMOS) transistor, a large scale integration (LSI) system, a flash memory, a DRAM, an SRAM, an electrically erasable programmable read-only memory (EEPROM), a PRAM, an MRAM, or an RRAM, an image sensor such as a CMOS imaging sensor (C1S), a micro-electro-mechanical system (MEMS), an active device, and a passive device. The plurality of individual devices may be formed in the first semiconductor device layer 110 in the cell region CR, and may be electrically connected to the conductive region of the first semiconductor substrate 100. The first semiconductor device layer 110 may further include a conductive wiring line or a conductive plug for electrically connecting at least two of the plurality of individual devices or the plurality of individual devices and the conductive region of the first semiconductor substrate 100. Also, the plurality of individual devices may be electrically isolated from other adjacent individual devices by insulating films.

The first semiconductor device layer 110 may include a plurality of wiring structures 112 for connecting the plurality of individual devices and other wiring lines formed in the first semiconductor substrate 100. Each of the plurality of wiring structures may include a conductive wiring layer such as a metal wiring layer 114 and a via plug 116. The metal wiring layer 114 and the via plug 116 may include a wiring barrier film and a wiring metal layer. The wiring barrier film may include at least one material selected from among titanium (Ti), titanium nitride (TiN), tantalum (Ta), and tantalum nitride (TaN). The wiring metal layer may include at least one metal selected from among tungsten (W), aluminium (Al), and copper (Cu). The metal wiring layer 114 and the via plug 116 may be formed of the same material. Alternatively, at least portions of the metal wiring layer 114 and the via plug 116 may include different materials. A plurality of the metal wiring layers 114 and/or the via plugs 116 may be stacked. That is, the plurality of wiring structures 112 may be multi-layer structures in which two or more metal wiring layers 114 or two or more via plugs 116 are alternately stacked.

The first through-electrode 120 may extend from the top surface 102 to the bottom surface 104 of the first semiconductor substrate 100 and may extend into the first semiconductor device layer 110. At least a portion of the first through-electrode 120 may have a pillar shape. The first through-electrode 120 may include a barrier film 122 that is formed on a surface of the pillar shape and a buried conductive layer 124 that is filled in the harrier film 122. The barrier film 122 may include at least one material selected from among Ti, TiN, Ta,TaN, ruthenium (Ru), cobalt (Co), manganese (Mn), tungsten nitride (WN), nickel (Ni), and nickel boride (NiB), and the buried conductive layer 124 may include at least one material selected from among Cu, a Cu alloy such as copper-tin (CuSn), copper-magnesium (CuMg), copper-nickel (CuNi), copper-zinc (CuZn), copper-palladium (CuPd), copper-gold (CuAu), copper-rhenium (CuRe), or copper-tungsten (CuW), tungsten (W), a W alloy, Ni, Ru, and Co. A via insulating film 126 may be disposed between the first semiconductor substrate 100 and the first through-electrode 120 and between the first semiconductor device layer 110 and the first through-electrode 120. The via insulating film 126 may include an oxide film, a nitride film, a carbide film, a polymer, or a combination thereof.

The first connection pad 132 may be disposed on the first semiconductor device layer 110 and may be electrically connected to the plurality of wiring structures 112 in the first semiconductor device layer 110. The first connection pad 132 may be electrically connected to the first through-electrode 120 through the plurality of wiring lines 112. The first connection pad 132 may include at least one of Al, Cu, Ni, W, platinum (Pt), or gold (Au).

A first passivation layer 130 that covers at least a portion of a top surface of the first connection pad 132 may be formed on the first semiconductor device layer 110. The first passivation layer 130 may be a protective layer for protecting the plurality of wiring structures 112 in the first semiconductor device layer 110 and other structures under the plurality of wiring structures 112 from an external impact or moisture. For example, the first passivation layer 130 may include an inorganic insulating film or an organic insulating film. In an embodiment, the first passivation layer 130 may be formed of silicon nitride. A hole 130H through which at least a portion of the top surface of the first connection pad 132 is exposed may be formed in the first passivation layer 130.

A first rear protective layer 136 may be formed on the top surface 102 of the first semiconductor substrate 100 to surround the first through-electrode 120. A first upper connection pad 134 that is electrically connected to the first through-electrode 120 may be formed on the first rear protective layer 136, overlying the top surface 102 of the first semiconductor substrate 100. The first upper connection pad 134 may include at least one of Al, Cu, Ni, W, Pt, or Au.

The first connection bump 140 may be disposed on the exposed portion of the first connection pad 132 and on a portion of the first passivation layer 130. The first connection bump 140 may be disposed on a lowermost surface of the semiconductor package 1. The first connection bump 140 may be a chip-substrate connection bump for mounting the semiconductor package 1 on an external substrate (not shown) or an interposer (not shown). The first connection hump 140 may receive at least one of a control signal, a power signal, or a ground signal for operating the first through fourth semiconductor chips C1, C2, C3, and C4 from the outside, may receive a data signal to be stored in the first through fourth semiconductor chips C1, C2, C3, and C4 from the outside, or may transmit data stored in the first through fourth semiconductor chips C1, C2, C3, and C4 to the outside.

The first connection bump 140 may include a first pillar structure 142 and a first solder layer 148. The first pillar structure 142 may include a first pillar layer 144 that is connected to the first connection pad 132 and a diffusion barrier layer 146 that is disposed on the first pillar layer 144. Therefore, the first connection bump 140 may have the first pillar layer 144 and the first solder layer 148 with the diffusion barrier layer 146 disposed therebetween.

In some embodiments, the first pillar layer 144 may include Ni, Cu, palladium (Pd), Pt, Au, or a combination thereof. For example, the first pillar layer 144 may include a material having a relatively low Young's modulus. For example, the first pillar layer 144 may include a material having a Young's modulus ranging from about 100 GPa to about 180 GPa. In some embodiments, the first pillar layer 144 may include, but not limited to, Cu or a Cu alloy. A material of the first pillar layer 144 will be described below in greater detail.

In some embodiments, the diffusion barrier layer 146 may include Ni, Co, Cu, or a combination thereof. The diffusion barrier layer 146 may include a material that is different from that of the first pillar layer 144. For example, when the first pillar layer 144 includes Cu, the diffusion barrier layer 146 may include Ni or a Ni alloy. The diffusion barrier layer 146 may prevent an excessive amount of intermetallic compounds from being formed due to a reaction between the first solder layer 148 and the first pillar layer 144, thereby preventing a void from being formed in the first solder layer 148.

Although not shown, an under bump metal (UBM) layer (not shown) may be further formed between the first pillar structure 142 and the first connection pad 132. The UBM layer may be a seed layer, an adhesive layer, or a barrier layer for forming the first pillar structure 142. For example, the UBM layer may include chromium (Cr), W, Ti, Cu, Ni, Al, Pd, Au, or a combination thereof.

The UBM layer may be a single layer of metal or may have a stacked structure including a plurality of metal layers. For example, the UBM layer may include a first metal layer, a second metal layer, and/or a third metal layer that are sequentially stacked on the first connection pad 132. The first metal layer may act as an adhesive layer for stably attaching the first connection bump 140 to the first connection pad 132 and/or the first passivation layer 130. The first metal layer may include a metal material having excellent adhesion properties to the first passivation layer 130. For example, the first metal layer may include at least one of Ti, Ti—W, Cr, or Al. The second metal layer may act as a barrier layer for preventing a metal material included in the first connection pad 132 from diffusing into the first semiconductor substrate 100. The second metal layer may include at least one of Cu, Ni, Cr—Cu, or Ni-vanadium (V). The third metal layer may act as a wetting layer for improving wetting properties of a seed layer or a solder layer for forming the first connection bump 140. The third metal layer may include at least one of Ni, Cu, or Al.

The first solder layer 148 may be disposed on the diffusion barrier layer 146. In some embodiments, the first solder layer 148 may have a spherical shape or a ball shape. The first solder layer 148 may include tin (Sn), indium (In), bismuth (Bi), antimony (Sb), Cu, silver (Ag), zinc (Zn), lead (Pb), and/or an alloy thereof. For example, the first solder layer 148 may include Sn, Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn or combinations thereof.

An intermediate layer (not shown) may be formed on a contact interface between the first solder layer 148 and the first pillar structure 142. The intermediate layer may include an intermetallic compound (IMC) that is formed due to a reaction between metal materials included in the solder layer 148 and the first pillar structure 142 at a relatively high temperature. For example, when the first pillar structure 142 includes Cu and/or Ni and the first solder layer 148 includes Sn and/or Cu, the intermediate layer may be formed to include at least one of $(Cu,Ni)_6Sn_5$, $(Cu,Ni)_3Sn_4$, or $(Cu,Ni)_3Sn$. A material or a combination of the intermediate layer is not, however, limited thereto, and may vary based on a material of the first pillar structure 142, a material of the first solder layer 148, and a temperature and a time of a reflow process.

As shown in FIG. 1B, the second semiconductor chip C2 may be mounted on the top surface of the first semiconductor chip C1, and the second connection bump 240 may be disposed between the first semiconductor chip C1 and the second semiconductor chip C2 to electrically connect the second semiconductor chip C2 and the first semiconductor chip C1. The second semiconductor chip C2 may include a second semiconductor substrate 200, a second semiconductor device layer 210, the second through-electrode 220, and the second connection pad 232.

As shown in FIG. 1D, a second passivation layer 230 is formed to cover a portion of a top surface of the second connection pad 232 and on the second semiconductor device layer 210. The second semiconductor chip C2 and the first semiconductor chip C1 have similar technical characteristics, and thus a detailed explanation of the second semiconductor chip C2 will be omitted.

Referring back to FIG. 1B, the second connection bump 240 may be disposed between the second connection pad 232 and the first upper connection pad 134 and may electrically connect the first semiconductor chip C1 and the second semiconductor chip C2. As shown in FIG. 1B, the second connection bump 240 may include a second pillar structure 242 and a second solder layer 248.

The second pillar structure 242 may be formed on the second connection pad 232 and the second passivation layer 230 and may be electrically connected to the second through-electrode 220. In some embodiments, the second pillar structure 242 may include a material that is different from a material included in the first pillar layer 144 of the first pillar structure 142. For example, the second pillar structure 242 may include a material having better high-temperature properties than a material included in the first pillar layer 144. In particular, since the second pillar structure 242 includes a material having better high-temperature properties than a material included in the first pillar layer 144, a void, which occurs due to a reaction between the second solder layer 248 and the second pillar structure 242 at a high temperature, may be prevented from being formed in the second solder layer 248. In some embodiments, the second pillar structure 242 may include Ni, Cu, Pd, Pt, Au, or a combination thereof. For example, the second pillar structure 242 may include, but not limited to, Ni or a Ni alloy.

The second solder layer 248 may be disposed between the second pillar structure 242 and the first upper connection pad 134. The second solder layer 248 may include Sn, In, Bi, Sb, Cu, Ag, Zn, Pb, and/or an alloy thereof. For example, the second solder layer 248 may include Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, or Sn—Bi—Zn.

Although not shown, an intermediate layer (not shown) may be formed on a contact interface between the second solder layer 248 and the second pillar structure 242 and/or a contact interface between the second solder layer 248 and the first upper connection pad 134. The intermediate layer may include an intermetallic compound formed due to a reaction between metal materials included in the second solder layer 248 and the first upper connection pad 134 and/or metal materials included in the second solder layer 248 and the second pillar structure 242.

The third semiconductor chip C3 may be mounted on a top surface of the second semiconductor chip C2 and the fourth semiconductor chip C4 may be mounted on a top surface of the third semiconductor chip C3. The third connection bump 340 may be disposed between the second semiconductor chip C2 and the third semiconductor chip C3 and the fourth connection bump 440 may be disposed between the third semiconductor chip C3 and the fourth semiconductor chip C4.

The third semiconductor chip C3 may include a third semiconductor substrate 300, a third semiconductor device layer 310, the third through-electrode 320, and the third connection pad 332. The fourth semiconductor chip C4 may include a fourth semiconductor substrate 400, a fourth semiconductor device layer 410, and the fourth connection pad 432. Since the third semiconductor chip C3 and the fourth semiconductor chip C4 may have technical characteristics similar to those of the first semiconductor chip C1, a detailed explanation of the third and fourth semiconductor chips C3 and C4 will be omitted.

The third connection bump 340 may be disposed between the third connection pad 332 and the second upper connection pad 234 and may electrically connect the second semiconductor chip C2 and the third semiconductor chip C3. The third connection bump 340 may include a third pillar structure 342 and a third solder layer 348. The fourth connection bump 440 may be disposed between the fourth connection pad 432 and the third upper connection pad 334 and may electrically connect the third semiconductor chip C3 and the fourth semiconductor chip C4. The fourth connection bump 440 may include a fourth pillar structure 442 and a fourth solder layer 448. Since the third connection bump 340 and the fourth connection bump 440 may have technical characteristics similar to those of the second connection bump 240, a detailed explanation of the third and fourth connection bumps 340 and 440 will be omitted. The second through fourth connection bumps 240, 340, and 440 may be inter-chips connection humps disposed between the first through fourth semiconductor chips C1, C2, C3, and C4.

In some embodiments, a first molding member 150 may surround the top surface of the first semiconductor chip C1 and side surfaces of the second through fourth semiconductor chips C2, C3, and C4. The first molding member 150 may include first through third insulating layers 152, 154, and 156 and a first molding layer 162.

The first insulating layer 152 may be disposed between the top surface of the first semiconductor chip C1 and a bottom surface of the second semiconductor chip C2 and may surround side surfaces of the second connection bump 240. The second insulating layer 154 may be disposed between the top surface of the second semiconductor chip C2 and a bottom surface of the third semiconductor chip C3 and may surround side surfaces of the third connection bump 340. The third insulating layer 156 may be disposed between the top surface of the third semiconductor chip C3 and a bottom surface of the fourth semiconductor chip C4 and may surround side surfaces of the fourth connection bump 440. As shown in FIG. 1B, side surfaces of the first through third insulating layers 152, 154, and 156 may protrude outward by a predetermined width in the X-direction. However, the inventive concept is not limited thereto.

The first molding layer 162 may surround the side surfaces of the first through third insulating layers 152, 154, and 156 and the side surfaces of the second through fourth semiconductor chips C2, C3, and C4. As shown in FIG. 1A, a width of the first semiconductor chip C1 in a horizontal direction (e.g., the X-direction) may be greater than widths of the second through fourth semiconductor chips C2, C3, and C4 in the horizontal direction, and the first molding layer 162 may contact an edge of a top surface of the first semiconductor chip C1, However, the inventive concept is not limited thereto. Also, the first molding layer 162 may be formed on a portion of a top surface of the fourth semiconductor chip C4 to a predetermined thickness. In some other embodiments, for example, the first molding layer 162 may not be formed on the top surface of the fourth semiconductor chip C4 and the top surface of the fourth semiconductor chip C4 may be exposed to the outside of the semiconductor package 1 in contrast to FIG. 1B.

In some embodiments, each of the first through third insulating layers 152, 154, and 156 may include an underfill material such as an insulating polymer or epoxy resin. The first molding layer 162 may include an epoxy mold compound (EMC).

In some embodiments, the first molding member 150 may surround the top surface of the first semiconductor chip C1 and the side surfaces of the second through fourth semiconductor chips C2, C3, and C4, and may include a single material layer. That is, the first molding member 150 may be disposed between the first through fourth semiconductor chips C1, C2, C3, and C4, and may surround the side surfaces of the second through fourth semiconductor chips C2, C3, and C4 and may surround the side surfaces of the second through fourth connection bumps 240, 340, and 440. In this case, since the first molding member 150 is not formed on the bottom surface of the first semiconductor chip C1, the first molding member 150 and the first connection bump 140 may not directly contact each other. In some embodiments, the first molding member 150 may include a material that is formed by using a molded underfill (MUF) method.

As shown in FIG. 1C, the first pillar structure 142 of the first connection bump 140 may have a first height HP1 in a vertical direction (e.g., the Z-direction). The first height HP1 of the first pillar structure 142 refers to a distance between an uppermost surface of the first pillar layer 144 that contacts the first connection pad 132 and a lowermost surface of the diffusion barrier layer 146 that contacts the first solder layer 148 in the Z-direction. The first height HP1 of the first pillar structure 142 may range from about 10 μm to about 30 μm. Also, the first solder layer 148 may have a second height HS1 in a vertical direction, and the second height HS1 of the first solder layer 148 may range, for example, from about 5 μm to about 30 μm. However, the first height HP1 of the first pillar structure 142 and the second height HS1 of the first solder layer 148 are not limited thereto.

As shown in FIG. 1D, the second pillar structure 242 of the second connection bump 240 may have a third height HP2 in a vertical direction (e.g., the Z-direction). The third height HP2 of the second pillar structure 242 refers to a distance between an uppermost surface of the second pillar structure 242 that contacts the second connection pad 232 and a lowermost surface of the second pillar structure 242 that contacts the second solder layer 248. The third height HP2 of the second pillar structure 242 may range from about 2 μm to about 10 μm. Also, the second solder layer 248 may have a fourth height HS2 in a vertical direction, and the fourth height HS2 of the second solder layer 248 may range, for example, from about 5 μm to about 20 μm. However, the third height HP2 of the second pillar structure 242 and the fourth height HS2 of the second solder layer 248 are not limited thereto.

The first height HP1 of the first pillar structure 142 of the first connection bump 140 may be greater than the third height HP2 of the second pillar structure 242 of the second connection bump 240. Also, the second height HS1 of the first solder layer 148 of the first connection bump 140 may be greater than the fourth height HS2 of the second solder layer 248 of the second connection bump 240. Accordingly, a height H1 (i.e., a sum of the first height HP1 and the second height HS1) of the first connection bump 140 in the Z-direction may be greater than a height H2 (i.e., a sum of the third height HP2 and the fourth height HS2) of the second connection bump 240 in the Z-direction.

In general, when a height of the connection bump 240 is too small, it may be difficult to perform an underfill process for filling a space between the connection bump 240 and the first and second semiconductor chips C1 and C2 or a space between the semiconductor chip C1 and an underlying substrate (not shown). When heights of the first and second connection bumps 140 and 240 are too large, a total thickness of the semiconductor package 1 may be increased and thus it may be difficult to obtain the semiconductor package 1 having a compact size. However, according to the semiconductor package 1 of the inventive concept, the first connection bump 140 that is a substrate-chip connection bump and the second connection bump 240 that is an inter-chips connection bump may have different structures and the height H1 of the first connection bump 140 may be greater than the height H2 of the second connection bump 240. Accordingly, a sufficient underfill interval may be ensured between the semiconductor package 1 and the substrate to be mounted under the semiconductor package 1, while the semiconductor package 1 having a compact size may be obtained.

Also, since the height Hi of the first connection bump 140 is greater than the height H2 of the second connection bump 240, even when warpage occurs in an underlying substrate (not shown) or an interposer (not shown), the first semiconductor package. I may be stably adhered to the lower substrate or the interposer through the first connection bump 140.

Also, the first connection bump 140 and the second connection bump 240 may have different structures and may include different materials. In detail, the first pillar layer 144 of the first connection hump 140 may include a material having a Young's modulus that is lower than that of a material included in the second pillar structure 242. For example, a Young's modulus of Cu may range from about 110 GPa to about 128 GPa and a Young's modulus of Ni may be about 200 GPa. The first pillar layer 144 may include Cu or a Cu alloy and the second pillar structure 242 may include Ni or a Ni alloy. That is, when the first pillar layer 144 includes a material having a Young's modulus that is lower than that of a material included in the second pillar structure 242, the first pillar layer 144 may have a relatively large elasticity responding to an external force or a pressure. Accordingly, even when a warpage occurs in an underlying substrate (not shown) or an interposer (not shown), since the first pillar layer 144 has a relatively large elasticity, a crack may be prevented from being formed in an interface between the first pillar layer 144 and the first solder layer 148.

Also, the second pillar structure 242 of the second connection bump 240 may include a material having better high-temperature properties than a material included in the first pillar layer 144 of the first connection bump 140. In general, when a semiconductor package in which a plurality of semiconductor chips are stacked is manufactured, an inter-chips connection bump for connecting the plurality of semiconductor chips may be exposed to multiple high-temperature processes. Accordingly, when high-temperature properties of a material included in the inter-chips connection bump are poor, a large amount of intermetallic compounds may be formed on a contact interface between a connection pad and a solder layer due to the multiple high-temperature processes. Once the large amount of intermetallic compounds are formed, the amount of solders included in the solder layer may be reduced and a void may be formed in the solder layer, thereby reducing the mechanical strength of a connection bump or the reliability of the semiconductor package. However, according to the semiconductor package 1, since the second through fourth connection bumps 240, 340, and 440 corresponding to inter-chips connection bumps may include a material having better high-temperature properties than a material included in the first connection bump 140, an excessive amount of intermetallic compounds may be prevented from being formed in a process of manufacturing the semiconductor package 1 in which the plurality of semiconductor chips C1, C2, C3, and C4 are stacked. Accordingly, the semiconductor package 1 including the second through fourth connection bumps 240, 340, and 440 may have a high mechanical strength and high reliability.

In conclusion, the first connection bump 140 includes a material having a Young's modulus that is lower than that of a material included in the second connection bump 240 and the second connection bump 240 includes a material having better high-temperature properties than a material included in the first connection bump 140. Accordingly, a crack may be prevented from being formed in the first connection bump 140 even when a warpage occurs during a process of mounting the first through fourth semiconductor chips C1, C2, C3, and C4 on a substrate, and a void may be prevented from being formed in the second connection bump 240 even when multiple high-temperature processes for stacking the plurality of semiconductor chips C1, C2, C3, and C4 are performed. The semiconductor package 1 may have high adhesion reliability.

Figure 2:
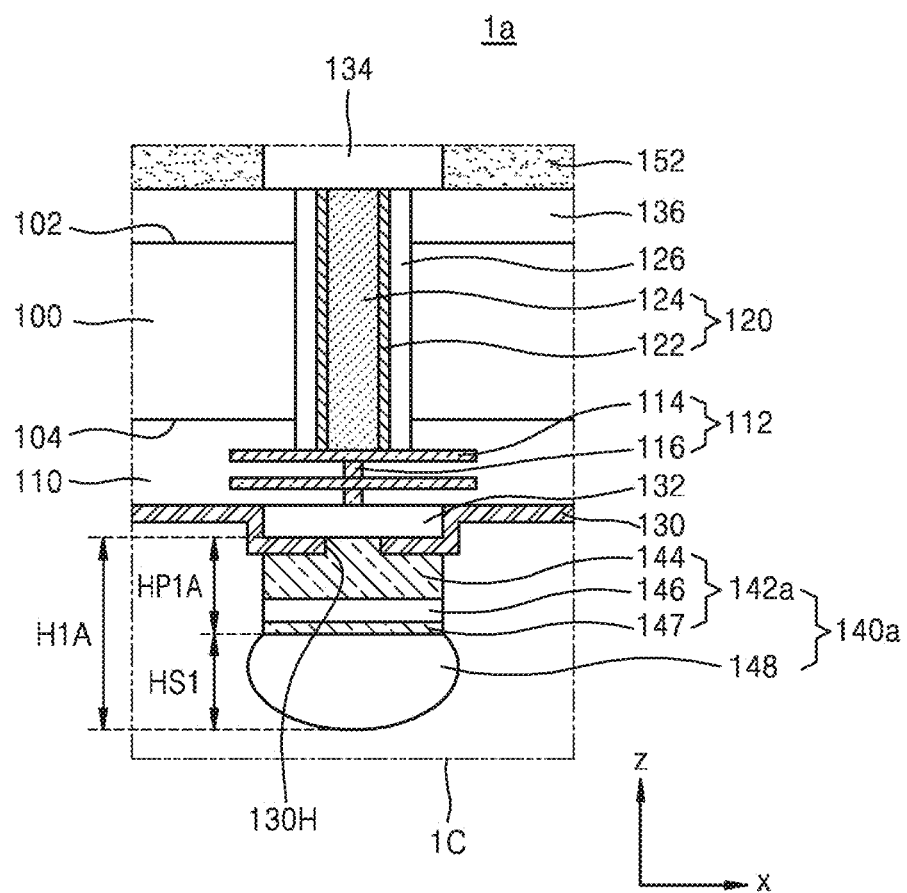
FIG. 2 is a cross-sectional view of a semiconductor package according to some embodiments.

FIG. 2 is a cross-sectional view of a semiconductor package 1a according to some embodiments. FIG. 2 is an enlarged view illustrating the portion 1C of FIG. 1B. In FIG. 2, the reference numerals that are the same as the reference numerals in FIGS. 1A through 1D denote the same elements. The semiconductor package 1a of FIG. 2 is similar to the semiconductor package 1 of FIGS. 1A through 1D except for a first pillar structure 142a of a first connection bump 140a, and thus the following will focus on the difference.

Referring to FIG. 2, the first connection bump 140a may include the first pillar structure 142a and the first solder layer 148, and the first pillar structure 142a may include the first pillar layer 144, the diffusion harrier layer 146, and an adhesive layer 147, which are sequentially stacked.

The first pillar layer 144 may be disposed on a portion of the first connection pad 132 and on a portion of the first passivation layer 130, and may include a material having a Young's modulus that is lower than that of a material included in the second pillar structure 242. For example, the first pillar layer 144 may include Cu or a Cu alloy. The diffusion barrier layer 146 may be formed on the first pillar layer 144 and may include a material that is different from that of the first pillar layer 144. For example, the diffusion barrier layer 146 may include Ni or a Ni alloy. The adhesive layer 147 may be disposed on the diffusion barrier layer 146 and may contact the first solder layer 148. The adhesive layer 147 may be an intermediate layer for stably adhering the first solder layer 148 and the first pillar structure 142. In some embodiments, the adhesive layer 147 may include Ni, Cu, Pd, Co, Pt, Au, or a combination thereof. For example, the adhesive layer 147 may include, but not limited to, Cu or a Cu alloy. The adhesive layer 147 may have a height ranging from, for example, about 2 µm to about 5 µm, in a vertical direction (e.g., the Z-direction). However, a height of the adhesive layer 147 may be appropriately selected according to a composition of the first solder layer 148 and the second height HS1 of the first solder layer 148.

In some embodiments, the first pillar structure 142a may have a first height HP1A ranging from about 10 µm to about 30 µm. The first solder layer 148 may have the second height. HS1 ranging from about 5 µm to about 30 µm. Since the first pillar structure 142a has a stacked structure, in which the first pillar layer 144, the diffusion barrier layer 146, and the adhesive layer 147 are sequentially stacked, the first height HP1A of the first pillar structure 142a may be relatively large, for example, larger than the height of the first pillar structure 142 of, for example, FIG. 1C. Accordingly, when the first connection bump 140a is mounted on an external substrate (not shown) or an interposer (not shown), a relatively large interval, or space, may be secured between the semiconductor package 1a and the external substrate or the interposer. A sufficient interval, or space, for forming an underfill material layer may be secured between the semiconductor package 1a and the external substrate or the interposer and side surfaces of the first connection bump 140a may be surrounded by the underfill material layer without a void.

Also, even when warpage occurs in the external substrate or the interposer in a process for mounting the semiconductor package 1a on the external substrate or the interposer, the first semiconductor package 1a and the external substrate or the interposer may be stably adhered to each other due to a height H1A of the first connection bump 140a that is relatively large.

Figure 3:
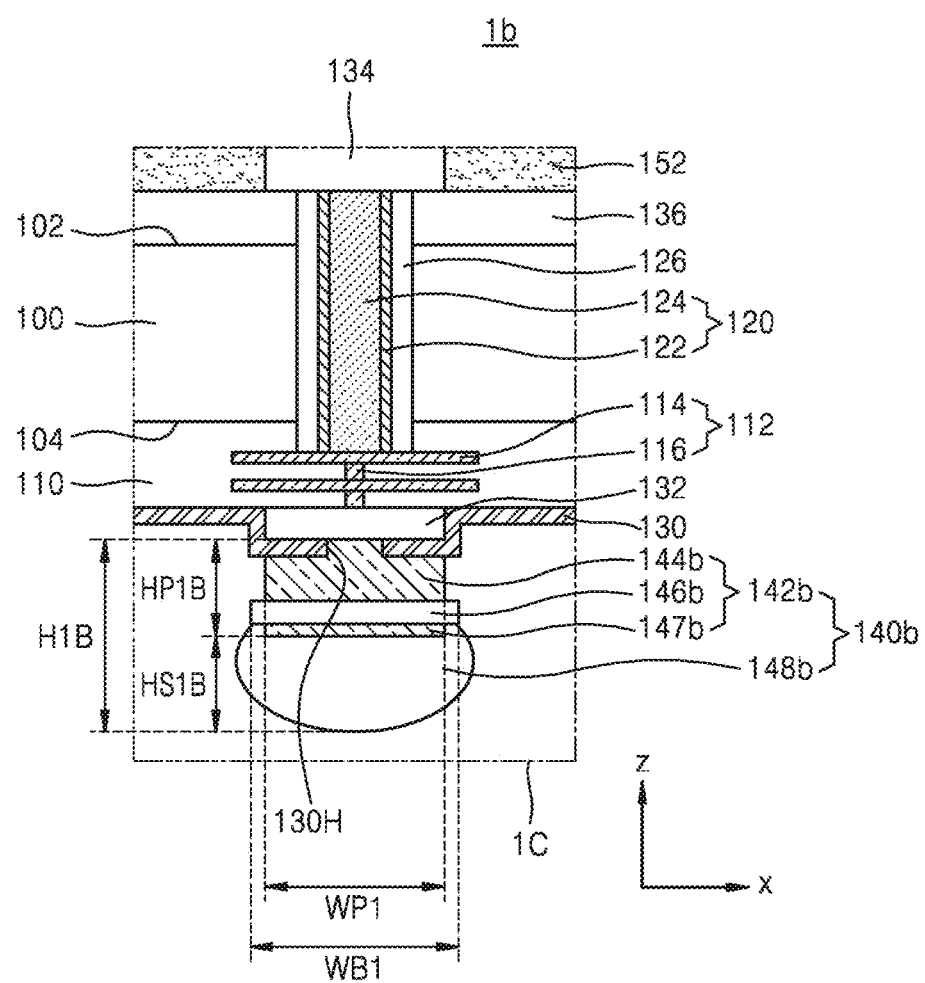
FIG. 3 is a cross-sectional view of a semiconductor package according to some embodiments.

FIG. 3 is a cross-sectional view of a semiconductor package 1b according to some embodiments. FIG. 3 is an enlarged view illustrating a portion corresponding to the portion 1C of FIG. 1B. In FIG. 3, the reference numerals that are the same as the reference numerals in FIGS. 1A through 2 denote the same elements. The semiconductor package 1b of FIG. 3 is similar to the semiconductor package 1 of FIGS. 1A through 1C except for a structure of a first connection bump 140b, and thus the following will focus on the difference.

Referring to FIG. 3, the first connection bump 140b may include a first pillar structure 142b and a first solder layer 148b, and the first pillar structure 142b may include a first pillar layer 144b, a diffusion barrier layer 146b, and an adhesive layer 147b, which are sequentially stacked.

The first pillar layer 144b may have a first width WP1 in the X-direction and the diffusion barrier layer 146b may have a second width WB1 that is greater than the first width WP1 in the X-direction. For example, the first width WP1 of the first pillar layer 144b may range from about 20 µm to about 40 µm and the second width WB1 of the diffusion barrier layer 146B may range from about 20 µm to about 45 µm. The first width WP1 of the first pillar layer 144b may range from about 80% to about 95% of the second width WB1 of the diffusion barrier layer 146b. The adhesive layer 147b may have substantially the same width as the first width WP1 of the first pillar layer 144b in the X-direction. However, the inventive concept is not limited thereto. Unlike in FIG. 3, the adhesive layer 147b may have substantially the same width as the second width WB1 of the diffusion barrier layer 146b.

The first solder layer 148b may contact a bottom surface and side surfaces of the adhesive layer 147b and edge portions of a bottom surface (i.e., a surface of the diffusion barrier layer 146b that contacts the adhesive layer 147b) of the diffusion barrier layer 146b that are not covered by the adhesive layer 147b. The first solder layer 148b may have a second height HS1B in the Z-direction and the second height HS1B may range from about 5 µm to about 40 µm.

Since widths of the adhesive layer 147b and the diffusion barrier layer 146h are different from each other, protrusions may be formed on side surfaces of the first pillar structure 142b. Additionally, a contact area between the adhesive layer 147b and the diffusion barrier layer 146h and the first solder layer 148b may be increased due to the protrusions. As a contact area between the first solder layer 148b and the first pillar structure 142b is increased, the amount or volume of the first solder layer 148b that may be placed on the first pillar structure 142h without collapsing may be increased, and the second height HS of the first solder layer 148b may also be increased.

Also, even when warpage occurs in a substrate or an interposer in a process for mounting the semiconductor package 1b on the substrate or the interposer, the semiconductor package 1h and the substrate or the interposer may be stably adhered to each other based on a height H1B of the first connection bump 140b that is relatively large and/or a relative large volume of the first solder layer 148b.

Figure 4:
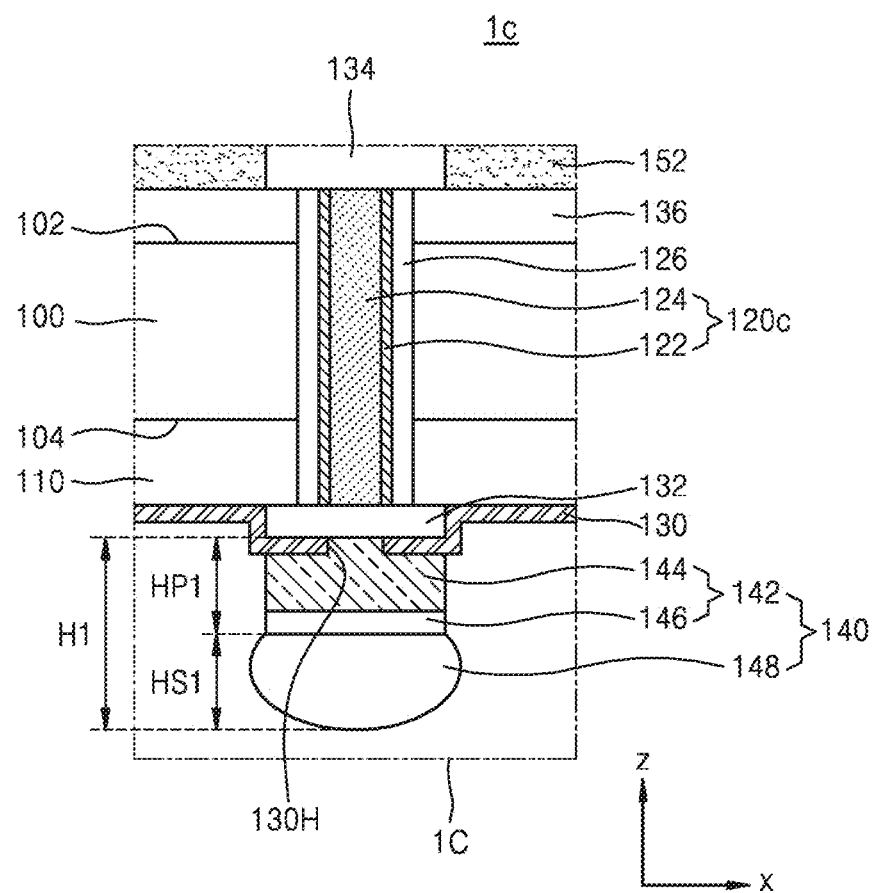
FIG. 4 is a cross-sectional view of a semiconductor package according to some embodiments.

FIG. 4 is a cross-sectional view of a semiconductor package 1c according to some embodiments. FIG. 4 is an enlarged view illustrating a portion corresponding to the portion 1C of FIG. 1B. In FIG. 4, the reference numerals that are the same as the reference numerals in FIGS. 1A through 3 denote the same elements. The semiconductor package 1c of FIG. 4 is similar to the semiconductor package 1 of FIGS. 1A through 1D except for a structure of a first through-electrode 120c, and thus the following description focuses on the difference.

Referring to FIG. 4, in a process for manufacturing the first semiconductor chip C1 (see FIG. 1B), the first through-electrode 120c may be formed after a plurality of individual devices (not shown) and the plurality of wiring structures 112 (see FIG. 1B) in the first semiconductor device layer 110 are formed. A portion of the first semiconductor device layer 110 including the plurality of individual devices may be referred to as a front-end-of-line (FEOL) structure and a portion of the first semiconductor device layer 110 including the plurality of wiring structures 112 may be referred to as a back-end-of-line (BEOL) structure. That is, the first through-electrode 120c may be formed after the FEOL structure and the BEOL structure are formed. The first through-electrode 120c may pass through the first semiconductor substrate 100 and the first semiconductor device layer 110. The conductive barrier film 122 of the first through-electrode 120c may include a first outer wall portion that is surrounded by the first semiconductor substrate 100 and a second outer wall portion that is surrounded by the first semiconductor device layer 110.

The first connection pad 132 may be formed on the first semiconductor device layer 110 to be located between the first through-electrode 120c and the first connection bump 140, and the first through-electrode 120c and the first connection bump 140 may be electrically connected to each other through the first connection pad 132. In some embodiments, as shown in FIG. 4, the First through-electrode 120c may directly contact the first connection pad 132 without the wiring structures 112 therebetween, which is unlike the embodiment shown in FIG. 2.

Figure 5:
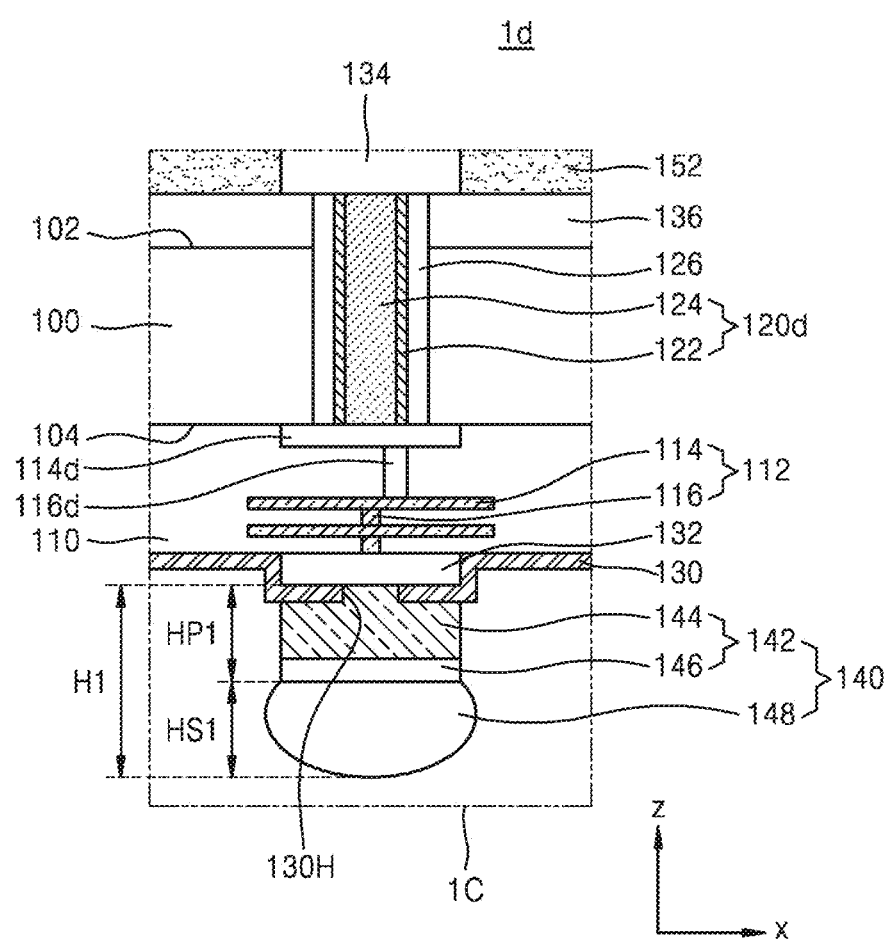
FIG. 5 is a cross-sectional view of a semiconductor package according to some embodiments.

FIG. 5 is a cross-sectional view of a semiconductor package 1d according to some embodiments, FIG. 5 is an enlarged view corresponding to the portion 1C of FIG. 1B, In FIG. 5, the reference numerals that are the same as the reference numerals in FIGS. 1A through 4 denote the same elements. The semiconductor package 1d of FIG. 5 is similar to the semiconductor package 1 of FIGS. 1A through 1D except for a structure of a first through-electrode 120d, and thus the following will focus on the difference.

Referring to FIG. 5, in a process for manufacturing the first semiconductor chip C1 (see FIG. 1B), after the first through-electrode 120d is formed, a plurality of individual devices (not shown) and the plurality of wiring structures 112 in the first semiconductor device layer 110 may be formed. That is, an FEOL structure and a BEOL structure may be formed after the first through-electrode 120d is formed. Accordingly, the first through-electrode 120d passes through the first semiconductor substrate 100 and does not extend into the first semiconductor device layer 110. The first through-electrode 120d may be connected to the plurality of wiring structures 112 of the BEOL structure through a conductive line 114d and a contact plug 116d included in the FEOL structure.

Figure 6:
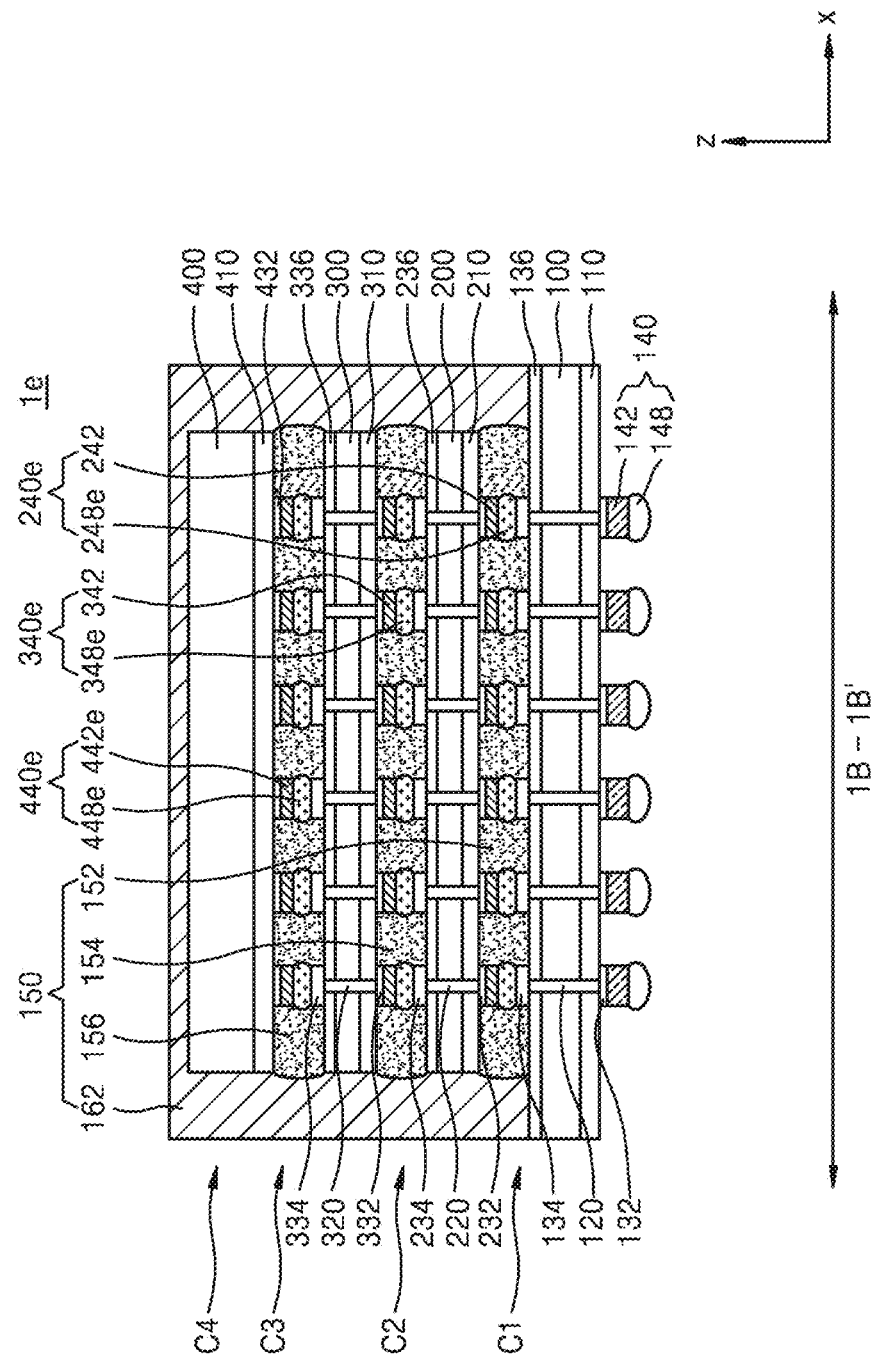
FIG. 6 is a cross-sectional view of a semiconductor package according to some embodiments.

FIG. 6 is a cross-sectional view of a semiconductor package 1e according to embodiments. FIG. 6 is a cross-sectional view taken along line 1B-1B' of FIG. 1A. In FIG. 6, the reference numerals that are the same as the reference numerals in FIGS. 1A through 5 denote the same elements. The semiconductor package 1e of FIG. 6 is similar to the semiconductor package 1 of FIGS. 1A through 1D except for structures of second through fourth connection bumps 240e, 340e, and 440e, and thus the following will focus on the difference.

Referring to FIG. 6, the second through fourth connection bumps 240e, 340e, and 440e may have structures that are different from that of the first connection bump 140. The first connection bump 140 may include the first pillar structure 142 and the first solder layer 148, and the second through fourth connection bumps 240e, 340e, and 440e may include the second through fourth pillar structures 242, 342, and 442 and second through fourth solder layers 248e, 348e, and 448e, respectively.

The first through fourth pillar structures 142, 242, 342, and 442 have similar technical characteristics to those described regarding FIGS. 1A through 1D, and thus a detailed explanation thereof will be omitted.

Each of the second through fourth solder layers 248e, 348e, and 448e may include a material having a higher melting point than that of a material included in the first solder layer 148. For example, each of the second through fourth solder layers 248e, 348e, and 448e may include Sn, In, Bi, Sb, Cu, Ag, Zn, Ph, and/or an alloy thereof. For example, a melting point of a material included in each of the second through fourth solder layers 248e, 348e, and 448e may be, but not limited to, higher by about 10° C. to about 200° C. than a melting point of a material included in the first solder layer 148.

In general, when a semiconductor package, in which a plurality of semiconductor chips are stacked, is manufactured, an inter-chips connection bump for connecting the plurality of semiconductor chips may be exposed to multiple high-temperature processes. Accordingly, when a melting point of a material included in the inter-chips connection bump is relatively low, a large amount of intermetallic compounds may be formed on a contact interface between a connection pad and a solder layer due to the plurality of high-temperature processes. Once the large amount of intermetallic compounds are formed, the amount of solders included in the solder layer may be reduced and a void may be formed in the solder layer, thereby reducing the mechanical strength of a connection bump or the reliability of the semiconductor package due to the void.

However, according to the semiconductor package 1e of the present inventive concept, since each of the second through fourth solder layers 248e, 348e, and 448e corresponding to inter-chips connection bumps may include a material having a melting point that is higher than that of a material included in the first solder layer 148, an excessive amount of intermetallic compounds may be prevented from being formed during a process of stacking the plurality of semiconductor chips C1, C2, C3, and C4. Accordingly, the semiconductor package 1e including the second through fourth connection bumps 240e, 340e, and 440e may have a high mechanical strength and high reliability.

Figure 7:
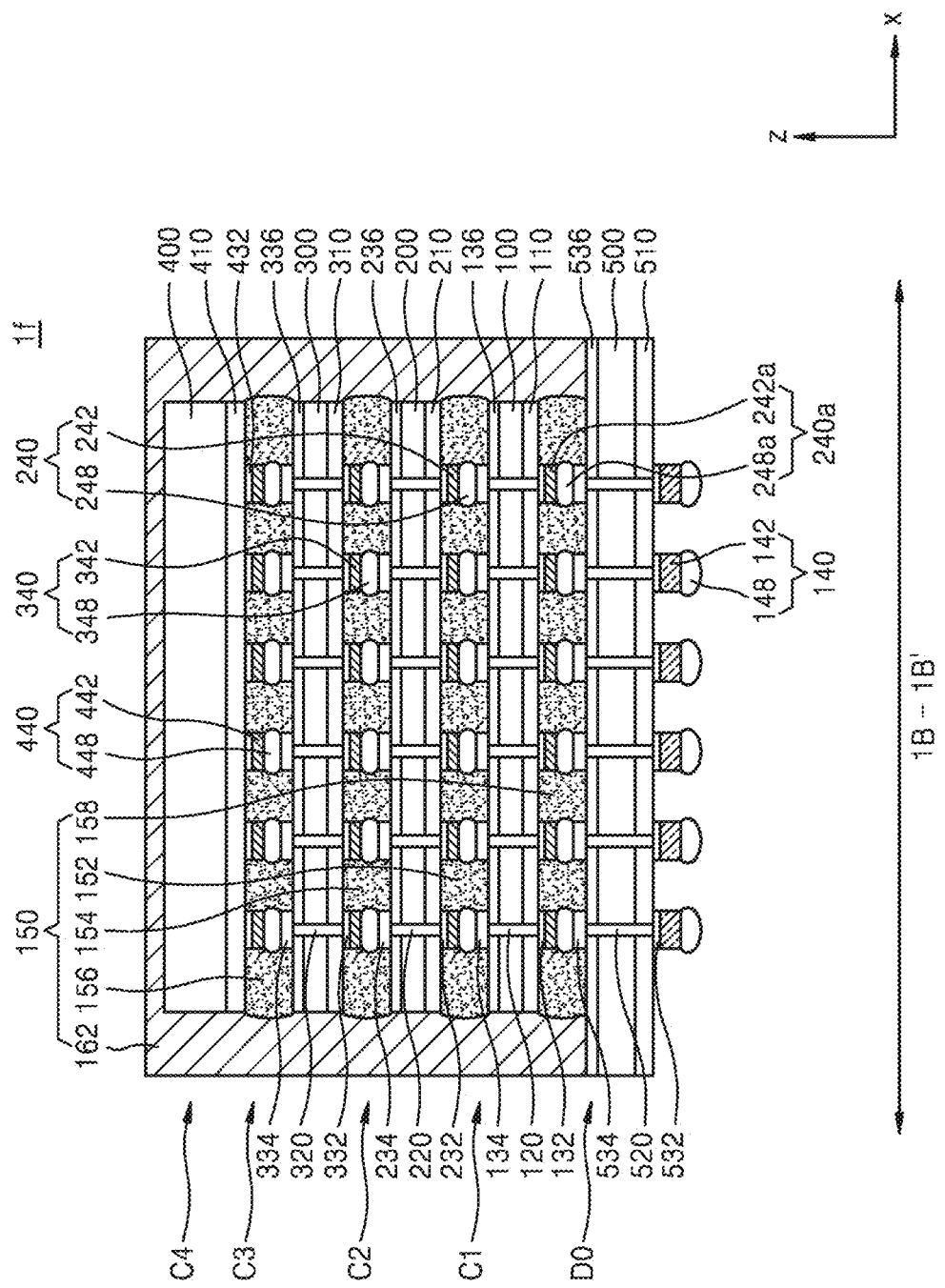
FIG. 7 is a cross-sectional view of a semiconductor package according to some embodiments.

FIG. 7 is a cross-sectional view of a semiconductor package 1f according to embodiments. FIG. 7 is a cross-sectional view taken along line 1B-1B' of FIG. 1A. In FIG. 7, the reference numerals that are the same as the reference numerals in FIGS. 1A through 6 denote the same elements. The semiconductor package 1f of FIG. 7 is similar to the semiconductor package 1 of FIGS. 1A through 1C except that a base die D0 is further formed, and thus the following will focus on the difference.

Referring to FIG. 7, the base die D0 may include a base substrate 500, an insulating interlayer 510, a base through-electrode 520, a base connection pad 532, and a base upper connection pad 534. The base through-electrode 520 may pass through the base substrate 500 from a top surface to a bottom surface of the base substrate 500, and may extend into the insulating interlayer 510. A plurality of wiring structures (not shown) may be formed in the insulating interlayer 510 and may be electrically connected to the base through-electrode 520.

The first connection hump 140 may be mounted on a bottom surface of the base die D0. In particular, the first connection bump 140 may be disposed on the base connection pad 532 that is disposed on the bottom surface of the base die D0. The technical features of the first connection bump 140 are similar to those described regarding FIGS. 1A through 1D.

The first through fourth semiconductor chips C1, C2, C3, and C4 may be stacked in a vertical direction (e.g., the Z-direction) on the top surface of the base die D0. A fifth connection bump 240a may be disposed between the base upper connection pad 534 that is disposed on the top surface of the base die D0 and the first connection pad 132 that is disposed on a bottom surface of the first semiconductor chip C1. The fifth connection bump 240a may include a fifth pillar structure 242e and a fifth solder layer 248a, and may have technical features that are similar to those of the second through fourth connection bumps 240, 340, and 440.

A fourth insulating layer 158 may be disposed between the base die D0 and the first semiconductor chip C1, and may surround side surfaces of the fifth connection bump 240a. The first molding layer 162 may surround an outer wall of the fourth insulating layer 158.

The base die D0 may be a dummy semiconductor chip that does not include individual devices included in the first through fourth semiconductor chips C1, C2, C3, and C4. The base die D0 may be a buffer die that may receive at least one of a control signal, a power signal, or a ground signal for operating the first through fourth semiconductor chips C1, C2, C3, and C4 through the base through-electrode 520 and the insulating interlayer 510 from the outside, may receive a data signal to be stored in the first through fourth semiconductor chips C1, C2, C3, and C4 front the outside, or may transmit data stored in the first through fourth semiconductor chips C1, C2, C3, and C4 to the outside.

According to the semiconductor package 1f, the first through fourth semiconductor chips C1, C2, C3, and C4 may be stacked on the base die D0 including the base through-electrode 520, which has the same structure as that of each of the first through fourth semiconductor chips C1, C2, C3, and C4. Accordingly, the second through fifth connection bumps 240, 340, 440, and 240a of the first through fourth semiconductor chips C1, C2, C3, and C4 are surrounded by the first molding member 150 and are not exposed to the outside of the semiconductor package 1F. Accordingly, undesired damage to the first through fourth semiconductor chips C1, C2, C3, and C4 may be avoided when the semiconductor package 1f is moved or stored.

Also, since each of the second through fifth connection bumps 240, 340, 440, and 240a that are inter-chips connection bumps includes a material having excellent high-temperature properties, a void may be prevented from being formed during multiple high-temperature processes. Since the first connection bump 140 that is a substrate-chip connection bump includes a material having a low Young's modulus, even when warpage occurs in a lower substrate or an interposer, excellent adhesion properties may be ensured. Accordingly, the semiconductor package 1f may have high adhesion reliability.

Figure 8:
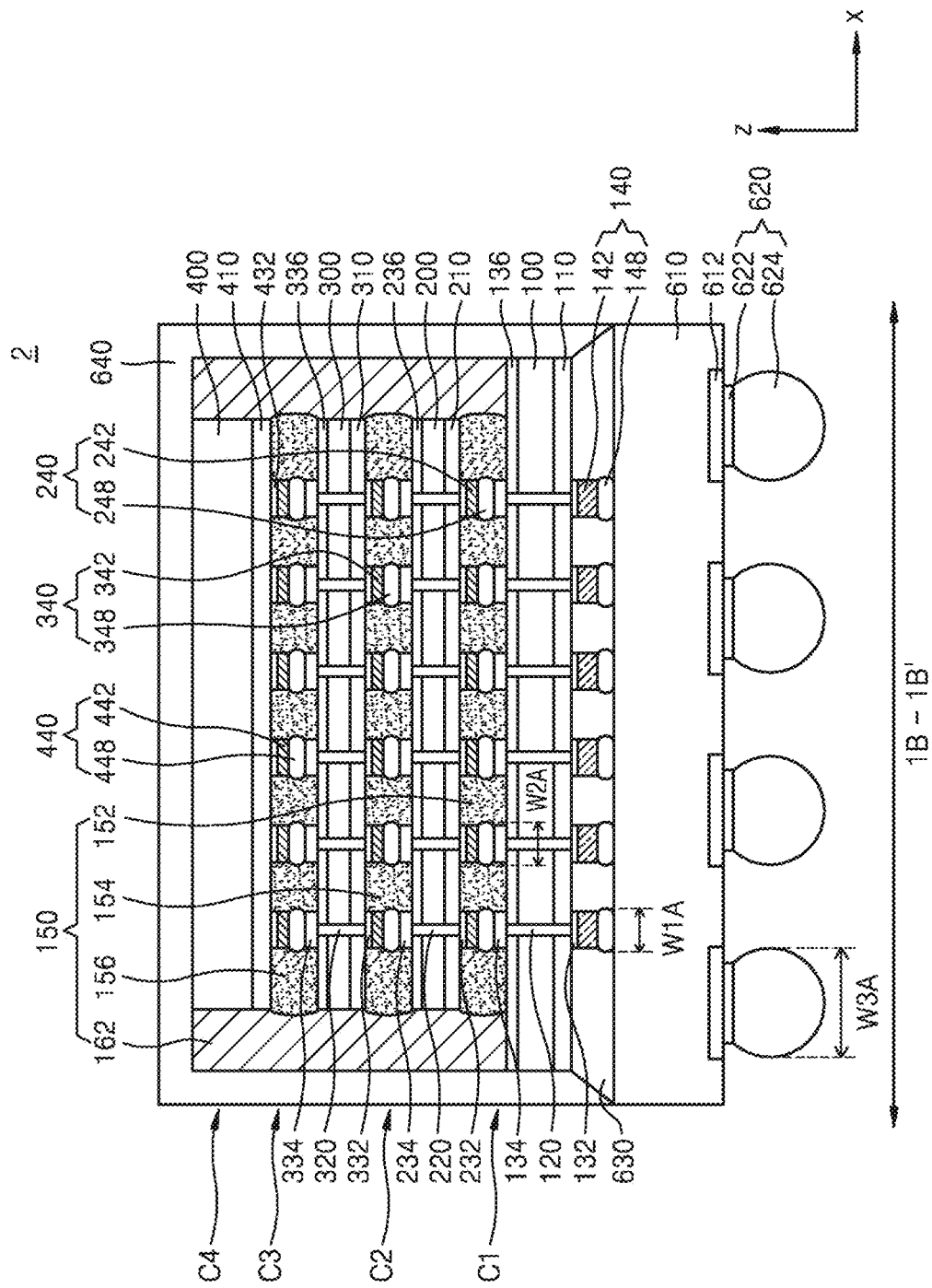
FIG. 8 is a cross-sectional view of a semiconductor package according to some embodiments.

FIG. 8 is a cross-sectional view of a semiconductor package 2 according to some embodiments. In FIG. 8, the reference numerals that are same as the reference numerals in FIGS. 1A through 7 denote the same elements. The semiconductor package 2 of FIG. 8 is similar to the semiconductor package 1 of FIGS. 1A through 1D except that a package substrate 610 is additionally formed, and thus the following will focus on the difference.

Referring to FIG. 8, the semiconductor package 2 may include the first through fourth semiconductor chips C1, C2, C3, and C4, which are sequentially stacked on the package substrate 610.

The first through fourth semiconductor chips C1, C2, C3, and C4 may be electrically connected to one another through the corresponding first through third through-electrodes 120, 220, and 320, and may be electrically connected to the package substrate 610 through the first through third through-electrodes 120, 220, and 320.

The package substrate 610 may be, for example, a printed circuit board (PCB), a ceramic substrate, or an interposer. When the package substrate 610 is a PCB, the package substrate 610 may include a substrate base, and a top pad (not shown) and a bottom pad (not shown) that are respectively formed on a top surface and a bottom surface of the substrate base. The top pad and the bottom pad may be exposed through a solder resist layer (not shown) that covers the top surface and the bottom surface of the substrate base. The substrate base may be formed of at least one material selected from among phenolic resin, epoxy resin, and polyimide. For example, the substrate base may include at least one material selected from among FR4, tetrafunctional epoxy, polyphenylene ether, epoxy/polyphenylene oxide, bismaleimide triazine (BT). Thermount®, cyanate ester, polyimide, and liquid crystal polymer, Each of the top pad and the bottom pad may be formed of Cu, Ni, stainless steel, or beryllium copper. An internal wiring line (not shown) that electrically connects the top pad and the bottom pad may be formed in the substrate base. The top pad and the bottom pad may be obtained by applying a Cu foil to the top surface and the bottom surface of the substrate base and exposing portions of a patterned circuit line through the solder resist layer.

When the package substrate 610 is an interposer, the package substrate 610 may include a substrate base formed of a semiconductor material and a top pad (not shown) and a bottom pad 612 that are respectively formed on a top surface and a bottom surface of the substrate base. The substrate base may be formed from, for example, a silicon wafer. Also, an internal wiring line (not shown) may be formed on the top surface or the bottom surface of the substrate base or in the substrate base. Also, a through-via (not shown) that electrically connects the top pad and the bottom pad 612 may be formed in the substrate base.

An external connection terminal 620 may be attached to a bottom surface of the package substrate 610. The external connection terminal 620 may be attached to, for example, the bottom pad 612. The external connection terminal 620 may be, for example, a solder ball or a bump. The external connection terminal 620 may electrically connect the semiconductor package 2 and an external apparatus. For example, the external connection terminal 620 may be disposed on the bottom surface of the package substrate 610, and may include an UBM layer 622 that is disposed on the bottom pad 612 and a solder ball 624 that is disposed on the UBM layer 622. The external connection terminal 620 tray further include an external connection pillar (not shown) disposed between the UBM layer 622 and the solder ball 624, and the external connection pillar may be formed of a conductive material, for example, Cu.

For example, the UBM layer 622 may include Cr, W, Ti, Cu, Ni, al, Pd, Au, or a combination thereof. The UBM layer 622 may be a single layer of metal, or may have a stacked structure including a plurality of metal layers. For example, the UBM layer 622 may include a first metal layer, a second metal layer, and/or a third metal layer that are sequentially stacked on the bottom pad 612. The first metal layer may act as an adhesive layer for stably attaching the solder ball 624 to the bottom pad 612. The first metal layer may include at least one from among, for example, Ti, Ti—W, Cr, and Al. The second metal layer may act as a barrier layer for preventing a metal material included in the bottom pad 612 from diffusing into the package substrate 610. The second metal layer may include at least one from among Cu, Ni, Cr—Cu, and Ni—V. The third metal layer may act as a wetting layer for improving wetting properties of the solder ball 624 or as a seed layer for forming the external connection pillar. The third metal layer may include at least one from among Ni, Cu, and Al. However, the structure and the material of the UBM layer 622 are not limited thereto.

In some embodiments, the external connection terminal 620 may have a width and/or a height that are greater than those of the first connection bump 140 and the second connection hump 240. For example, the first and second connection bumps 140 and 240 may respectively have a first width W1A and a second width W2A in a horizontal direction, and each of the first width W1A and the second width W2A may range from about 20 µm to about 50 µm. The external connection terminal 620 may have a third width W3A in a horizontal direction, and the third width W3A may be greater than 50 µm. Also, the external connection terminal 620 may have a height that is equal to or greater than about 50 µm in a vertical direction (e.g., a Z-direction). However, the third width W3A and/or the height of the external connection terminal 620 are not limited thereto.

An underfill material layer 630 may be formed between the package substrate 610 and the first semiconductor chip C1. The underfill material layer 630 may be disposed between the package substrate 610 and the first semiconductor chip C1 and may surround side surfaces of the first connection bump 140. The underfill material layer 630 may be formed of an organic material, for example, epoxy resin. In an embodiment, the underfill material layer 630 may be a portion of a second molding member 640 that is formed by using an MUF method.

The second molding member 640 that surrounds part or the whole of the first through fourth semiconductor chips C1, C2, C3, and C4 may be formed on the package substrate 610. The second molding member 640 may surround the first molding member 150 and may not directly contact side surfaces of the first through fourth semiconductor chips C1, C2, C3, and C4. The second molding member 640 may be formed of, for example, an EMC.

In an embodiment, the second molding ember 640 may expose a top surface of the fourth semiconductor chip C4, and a heat-dissipating member (not shown) may be attached to the second molding member 640 and the fourth semiconductor chip C4 with a thermal interface material (TIM) layer (not shown) therebetween.

The TIM layer may be formed of an insulating material or a material that includes an insulating material and thus may reduce or prevent transmission of electricity. The TIM layer may include, for example, epoxy resin. The TIM layer may be, for example, mineral oil, grease, gap filler putty, phase-change gel, phase-change material pad, or particle-filled epoxy.

The heat-dissipating member may be, for example, a heat sink, a heat spreader, a heat pipe, or a liquid-cooled cold plate.

According to the semiconductor package 2, since each of the second through fourth connection bumps 240, 340, and 440 that are inter-chips connection bumps includes a material having desirable high-temperature properties, a void may be prevented from being formed during multiple high-temperature processes. Since the first connection bump 140 that is a substrate-chip connection bump includes a material having a low Young's modulus, even when warpage occurs in the package substrate 610, excellent adhesion properties may be obtained. Accordingly, the semiconductor package 2 may have high adhesion reliability.

Figure 9:
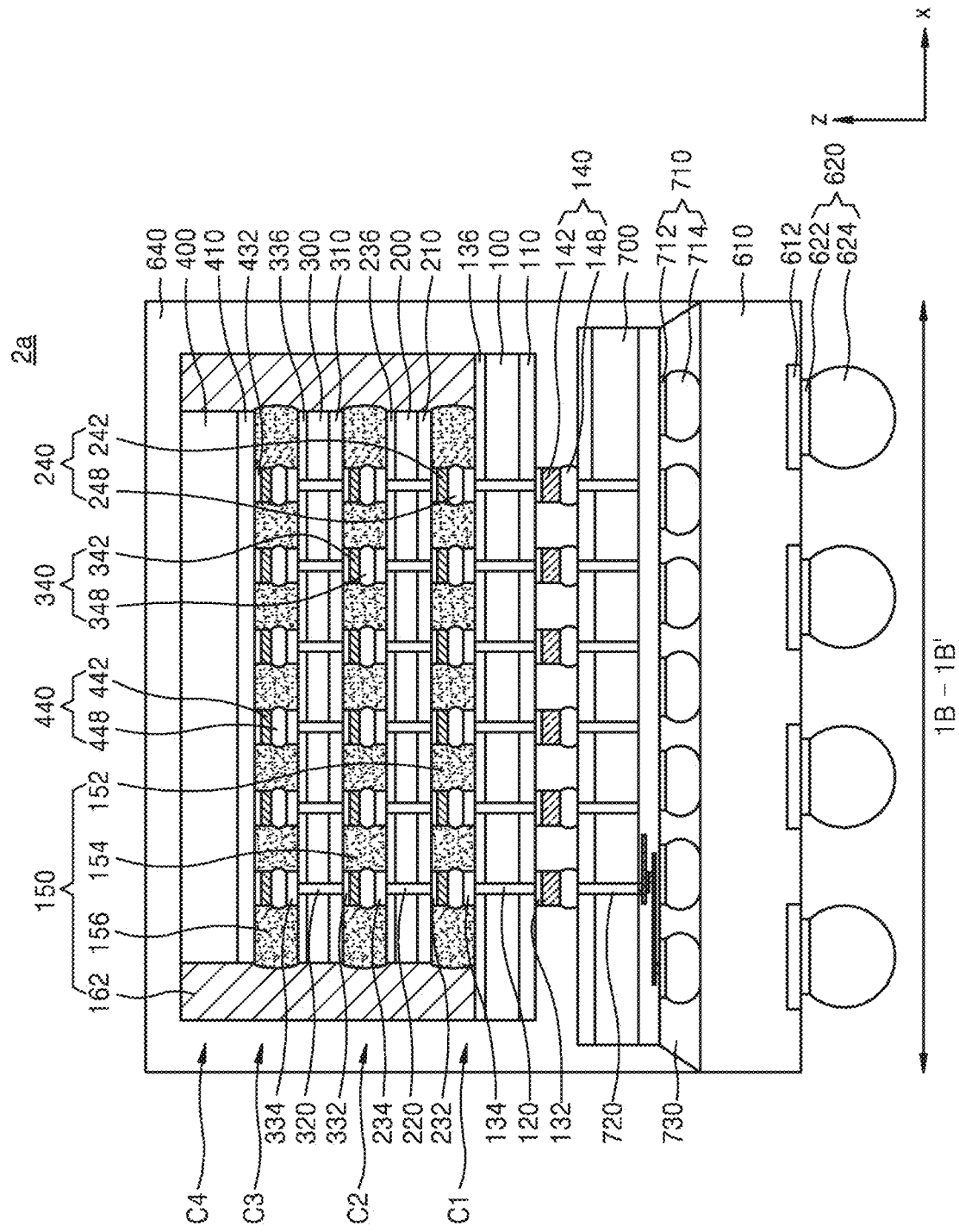
FIG. 9 is a cross-sectional view of a semiconductor package according to some embodiments.

FIG. 9 is a cross-sectional view of a semiconductor package 2a according to embodiments. In FIG. 9, the reference numerals that are the same as the reference numerals in FIGS. 1A through 8 denote the same elements.

Referring to FIG. 9, the semiconductor package 2a includes a main semiconductor chip 700 that is attached to the package substrate 610 and the first through fourth semiconductor chips C1, C2, C3, and C4 that are sequentially stacked on the main semiconductor chip 700.

The semiconductor package 2a of FIG. 9 is similar to the semiconductor package 2 of FIG. 8 except that the main semiconductor chip 700 is additionally formed, and thus a repeated explanation will be omitted.

The main semiconductor chip 700 may be a processor unit. The main semiconductor chip 700 may be, for example, a microprocessor unit (MPU) or a graphic processor unit (CPU). In an embodiment, the main semiconductor chip 700 may be a package, that is, a known good package (KGP) that is known to be free of defects. The main semiconductor chip 700 may include a main through-electrode 720. The main through-electrode 720 has a structure similar to that of each of the first through third through-electrodes 120, 220, and 320 of the first through fourth semiconductor chips C1, C2, C3, and C4, and thus a detailed explanation thereof will not be given.

The first through third through-electrodes 120, 220, and 320 of the first through fourth semiconductor chips C1, C2, C3, and C4 may be electrically connected to the main through-electrode 720 of the main semiconductor chip 700.

A main connection terminal 710 may be attached to a bottom surface of the main semiconductor chip 700. The first through fourth semiconductor chips C1, C2, C3, and C4 and the main semiconductor chip 700 may be electrically connected to the package substrate 610 through the main connection terminal 710. For example, the main connection terminal 710 may include a UBM layer 712 that is disposed on the bottom surface of the main semiconductor chip 700 and a solder ball 714 that is disposed on the UBM layer 712. The main connection terminal 710 may further include a main connection pillar (not shown) that is disposed between the UBM layer 712 and the solder ball 714, and the main connection pillar may include a conductive material, for example, Cu. In some embodiments, the main connection terminal 710 may have a width in a horizontal direction (e.g., the X-direction) and/or a height in a vertical direction (e.g., the Z-direction) that are greater than those of the first connection bump 140 and the second connection bump 240. For example, a width of the main connection terminal 710 in the horizontal direction (e.g., the X-direction) may be equal to or greater than about 50 μm and a height of the main connection terminal 710 in the vertical direction (e.g., the Z-direction) may be equal to or greater than about 50 μm. However, the width and/or the height of the main connection terminal 710 are not limited thereto.

In an embodiment, an underfill material layer 730 that surrounds the main connection terminal 710 may be additionally formed between the main semiconductor chip 700 and the package substrate 610. The underfill material layer 730 may be formed of an organic material, for example, epoxy resin. In an embodiment, the underfill material layer 730 may be a portion of the second molding member 640 that is formed by using an MUF method.

According to the semiconductor package 2a, since each of the second through fourth connection bumps 240, 340, and 440 that are inter-chips connection bumps includes a material having excellent high-temperature properties, a void may be prevented from being formed in a plurality of high-temperature processes. Since the first connection bump 140 that is a substrate-chip connection bump includes a material having a low Young's modulus, even when warpage occurs in the package substrate 610, excellent adhesion properties may be ensured. Accordingly, the semiconductor package 2a may have high adhesion reliability.

Figure 10:
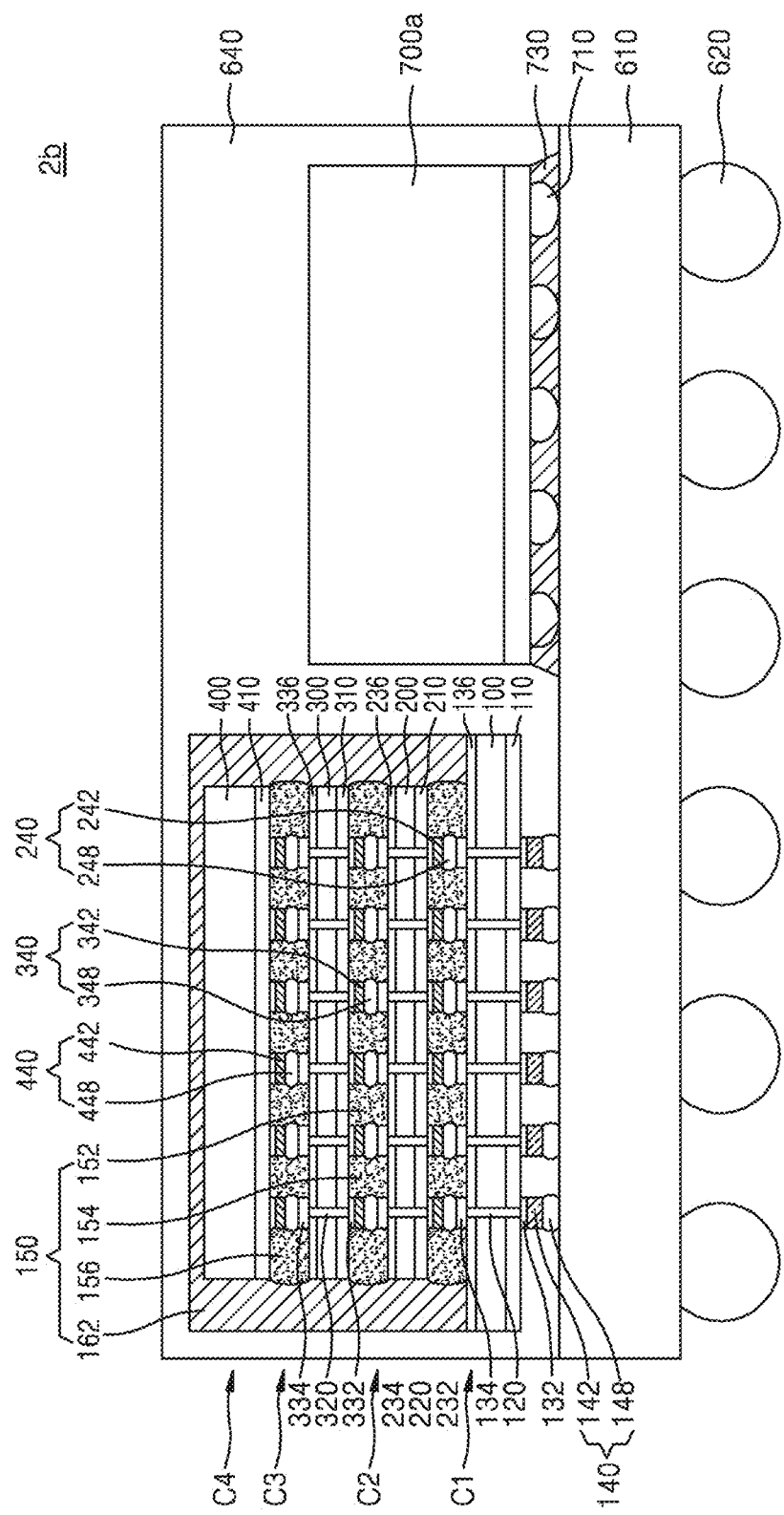
FIG. 10 is a cross-sectional view of a semiconductor package according to some embodiments.

FIG. 10 is a cross-sectional view of a semiconductor package 2b according to embodiments. In FIG. 10, the reference numerals that are the same as the reference numerals in FIGS. 1A through 9 denote the same elements.

Referring to FIG. 10, the semiconductor package 2h includes a main semiconductor chip 700a that is attached to the package substrate 610 and the first through fourth semiconductor chips C1, C2, C3, and C4 that are sequentially stacked on the package substrate 610.

The semiconductor package 2b of FIG. 10 is similar to the semiconductor package 2a of FIG. 9 except that the main semiconductor chip 700a and the sequentially stacked first through fourth semiconductor chips C1, C2, C3, and C4 are attached to different portions of the package substrate 610, and thus a detailed explanation thereof will not be given. That is, the semiconductor package 2b of FIG. 10 includes a main semiconductor chip 700a and the sequentially stacked first through fourth semiconductor chips C1, C2, C3 and C4 spaced apart from each other whereas the first through fourth semiconductor chips C1, C2, C3 and C4 are sequentially stacked on a main semiconductor chip 700a in FIG. 9.

FIGS. 11 through 21 are cross-sectional views for describing a method of manufacturing a semiconductor package according to a process order according to embodiments. In one embodiment, the method may be a method of manufacturing the semiconductor package 1 of FIGS. 1A through 1D.

Figure 11:
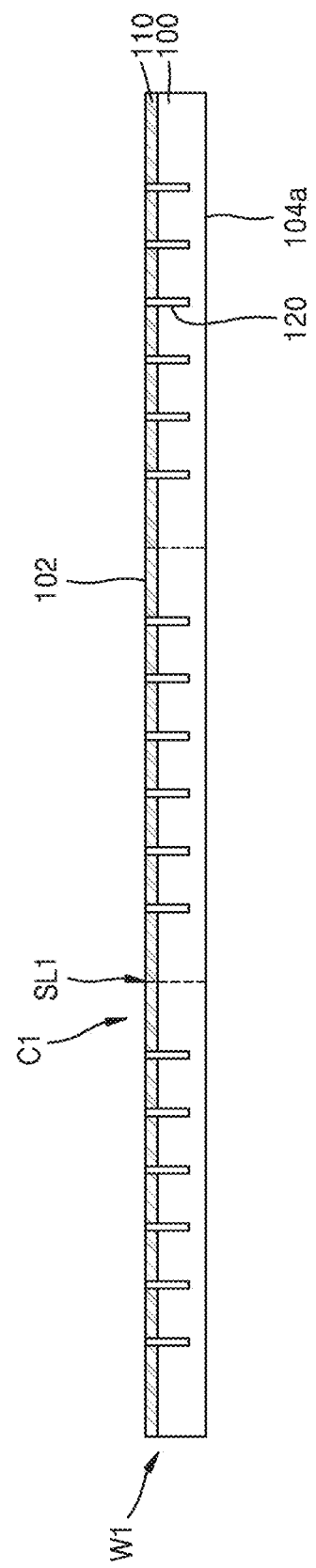
FIGS. 11 through 21 are cross-sectional views for explaining a method of manufacturing a semiconductor package according to a process order according to some embodiments.

Referring to FIG. 11, a first semiconductor wafer W1 is prepared. The first semiconductor wafer W I may include a plurality of the first semiconductor chips C1 that are divided by first scribe lanes SL1. Each of the first semiconductor chips C1 includes the first semiconductor substrate 100, the first semiconductor device layer 110, and the first through-electrode 120. The first semiconductor substrate 100 may have a first top surface 102 and a first bottom surface 104a that are opposite from each other. The first semiconductor device layer 110 may be formed on the first top surface 102 of the first semiconductor substrate 100. The first through-electrode 120 may pass through the first semiconductor device layer 110 from the first top surface 102 of the first semiconductor substrate 100 and may extend into the first semiconductor substrate 100.

The first semiconductor device layer 110 may include an LSI system, a flash memory, a DRAM, an SRAM, an EEPROM, a PRAM, an MRAM, and/or an RRAM. The first semiconductor device layer 110 may include a plurality of wiring structures for connecting a plurality of individual devices to other wiring lines formed in the first semiconductor substrate 100.

The first through-electrode 120 may extend from the first top surface 102 of the first semiconductor substrate 100 into the first semiconductor substrate 100. At least a part of the first through-electrode 120 may have a pillar shape. The first through-electrode 120 may include a barrier film that is formed on a surface of the pillar shape and a buried conductive layer that is filled in the barrier film. A via insulating film may be disposed between the first semiconductor substrate 100 and the first through-electrode 120. The via insulating film may include an oxide film, a nitride film, a carbide film, a polymer, or a combination thereof.

The first through-electrode 120 may be formed by removing a part of the first semiconductor substrate 100 and making conductive materials pass through the part of the first semiconductor substrate 100 that has been removed in a subsequent process. For example, the first through-electrode 120 may include the barrier film and a buried conductive layer that fills the barrier film. Alternatively, the first through-electrode 120 may include, for example, the barrier film, the buried conductive layer that is filled in the barrier film, and a part of a metal wiring layer and/or a via plug.

Figure 12:
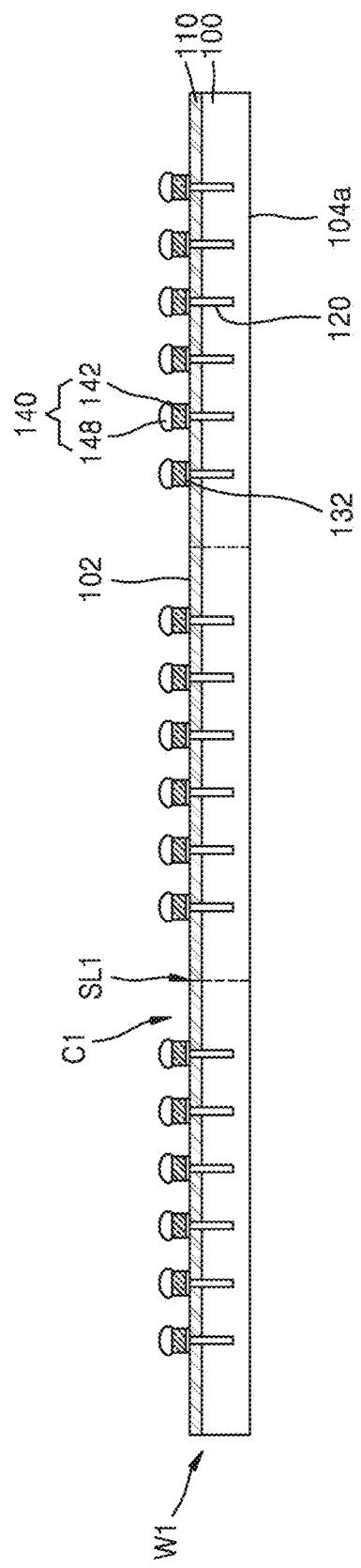

Referring to FIG. 12, the first connection hump 140 that is electrically connected to the first through-electrode 120 is formed on the first semiconductor substrate 100. Before the first connection bump 140 is formed, the first connection pad 132 may be formed to be disposed between the first through-electrode 120 and the first connection bump 140.

The first connection bump 140 may include the first pillar structure 142 and the first solder layer 148. In order to form the first connection bump 140, a mask pattern (not shown) having an opening (not shown) through which a portion of the first connection pad 132 is exposed may be formed on the first semiconductor device layer 110. Next, the first pillar structure 142 and the first solder layer 148 may be sequentially formed on the portion of the first connection pad 132 that is exposed through the mask pattern. In an embodiment, the first pillar structure 142 and the first solder layer 148 may be formed by performing an electroplating process.

In some embodiments, the first pillar structure 142 may include the first pillar layer 144 (see FIG. 1C) and the diffusion barrier layer 146 (see FIG. 1C) that are sequentially formed on the first connection pad 132. In other embodiments, the first pillar structure 142a (see FIG. 2) may include the first pillar layer 144 (see FIG. 2), the diffusion barrier layer 146 (see FIG. 2), and the adhesive layer 147 (see FIG. 2) that are sequentially formed on the first connection pad 132. In other embodiments, an additional etching process for removing side walls of the first pillar layer 144b (see FIG. 3) and the adhesive layer 147b (see FIG. 3) by a predetermined width may be further performed using an etching condition in which the diffusion harrier layer 146b (see FIG. 3) may be hardly etched.

Next, the first solder layer 148 having a convex shape may be formed by removing the mask pattern and reflowing the first solder layer 148 by using thermal treatment.

Figure 13:
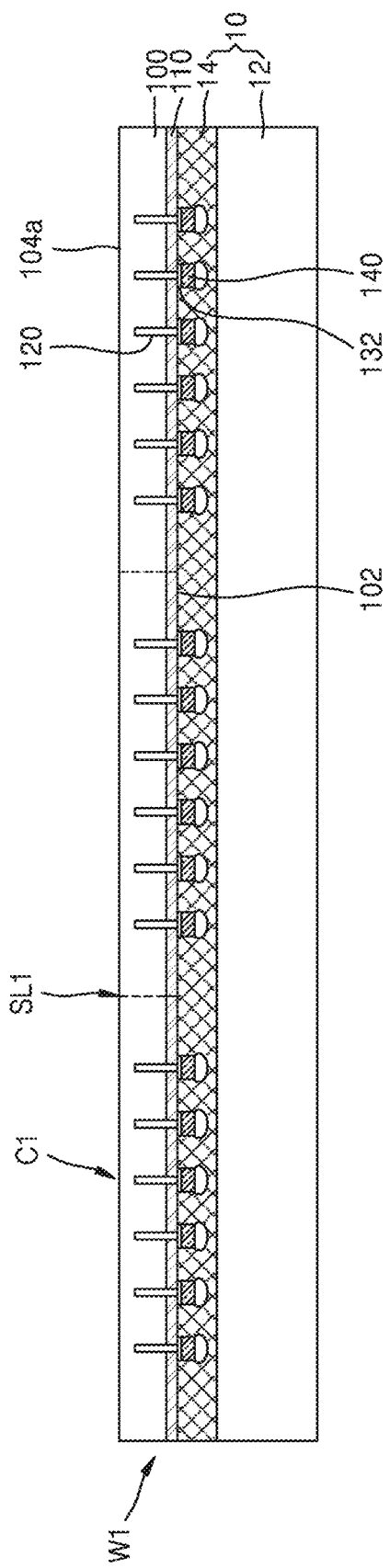

Referring to FIG. 13, the first semiconductor wafer W1 including the first connection bump 140 is attached to a first carrier substrate 10. The first carrier substrate 10 may include a first support substrate 12 and a first adhesive material layer 14. The first semiconductor wafer W1 may be attached to the first carrier substrate 10 so that the first connection bump 140 faces the first carrier substrate 10. The first connection bump 140 may be surrounded by the first adhesive material layer 14. A portion of the first top surface 102 of the first semiconductor substrate 100 that is exposed through the first connection bump 140 may contact the first adhesive material layer 14.

Figure 14:
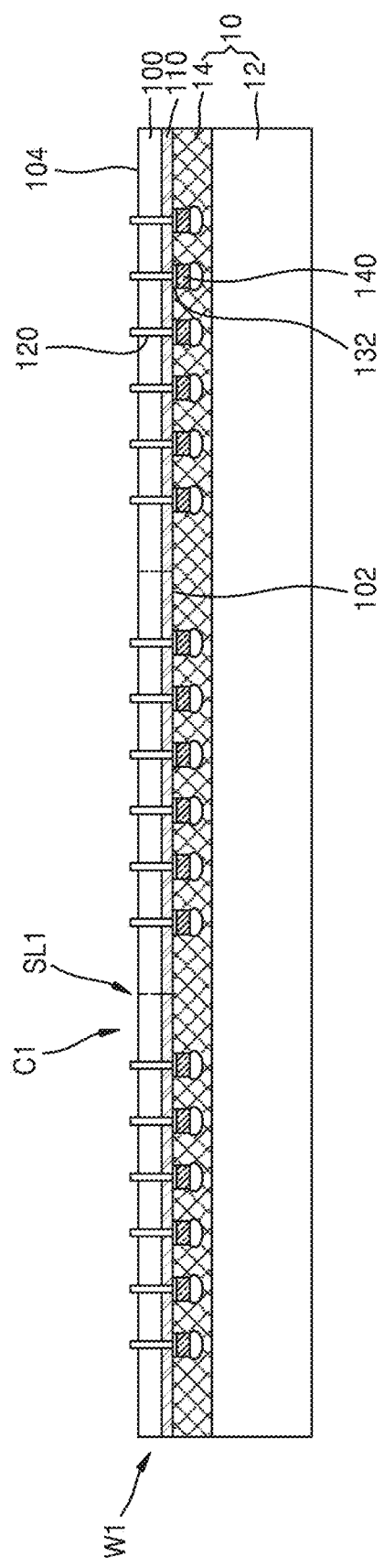

Referring to FIG. 14, the first through-electrode 120 is exposed by removing a portion of the first semiconductor substrate 100. The first through-electrode 120 may be exposed on the first bottom surface 104 of the first semiconductor substrate 100. Since the first through-electrode 120 is exposed on the first bottom surface 104 of the first semiconductor substrate 100, the first through-electrode 120 may pass through the first semiconductor substrate 100. Alternatively, a portion of the first semiconductor substrate 100 may be removed so that the first through-electrode 120 protrudes beyond the first bottom surface 104.

In order to expose the first through-electrode 120, a portion of the first semiconductor substrate 100 may be removed by using a chemical mechanical polishing (CMP) process, an etch-back process, or a combination thereof.

Figure 15:
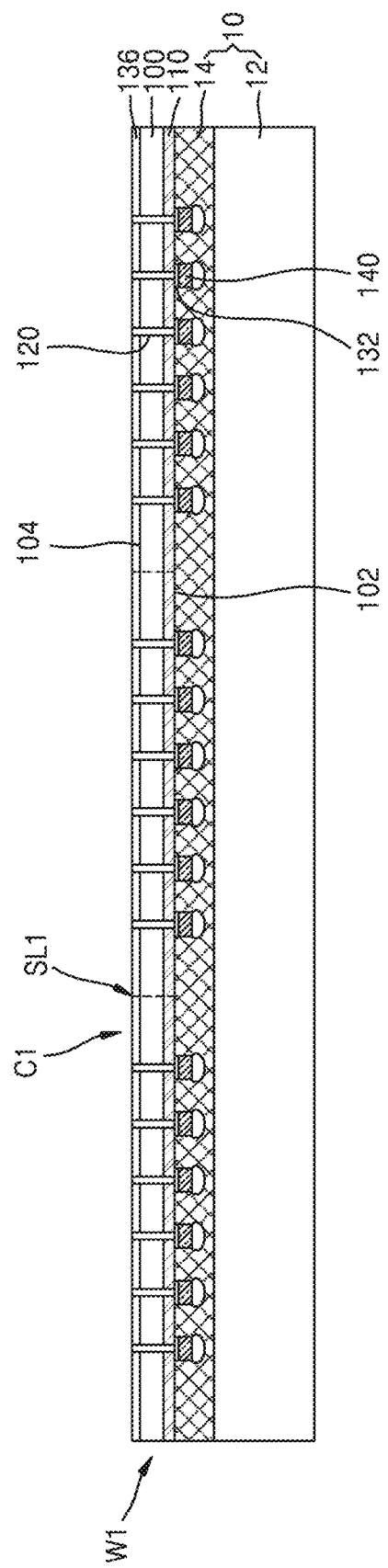

Referring to FIG. 15, the first rear protective layer 136 is formed to cover an exposed surface of the first semiconductor wafer W1. That is, the first rear protective layer 136 is formed to cover the first bottom surface 104 of the first semiconductor substrate 100. The first rear protective layer 136 may be formed by using, for example, a spin coating process or a spray process. The first rear protective layer 136 may be formed from, for example, an insulating polymer. In order to form the first rear protective layer 136, an insulating polymer film may be formed that covers the first bottom surface 104 of the first semiconductor substrate 100 and the first through-electrode 120, and then a part of the insulating polymer film may be removed by using an etch-back process to expose a portion of the first through-electrode 120.

Figure 16:
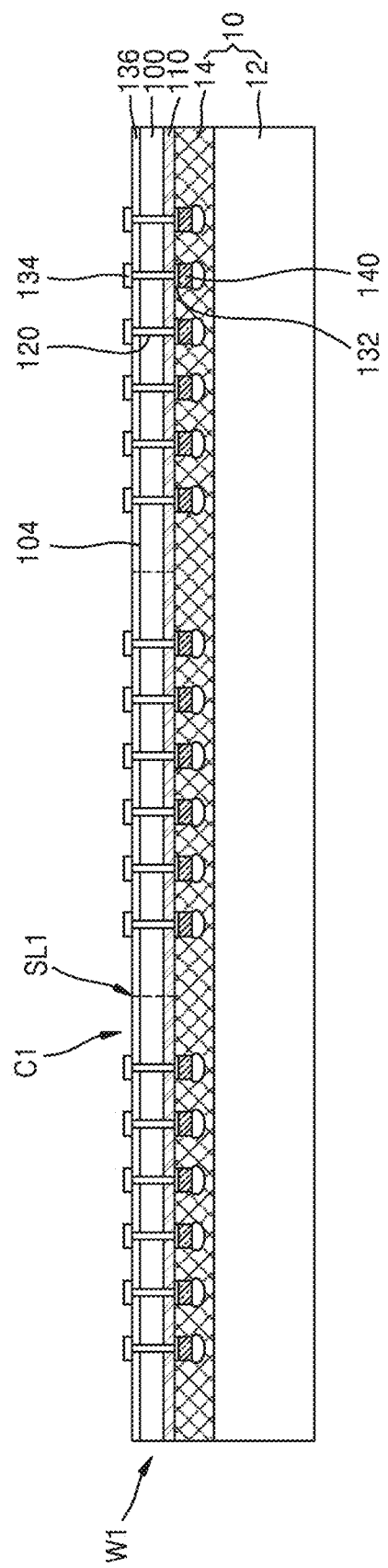

Referring to FIG. 16, the first upper connection pad 134 that is electrically connected to the portion of the first through-electrode 120 that is exposed through the first rear protective layer 136 is formed. Alternatively, the first upper connection pad 134 may not be formed.

Figure 17:
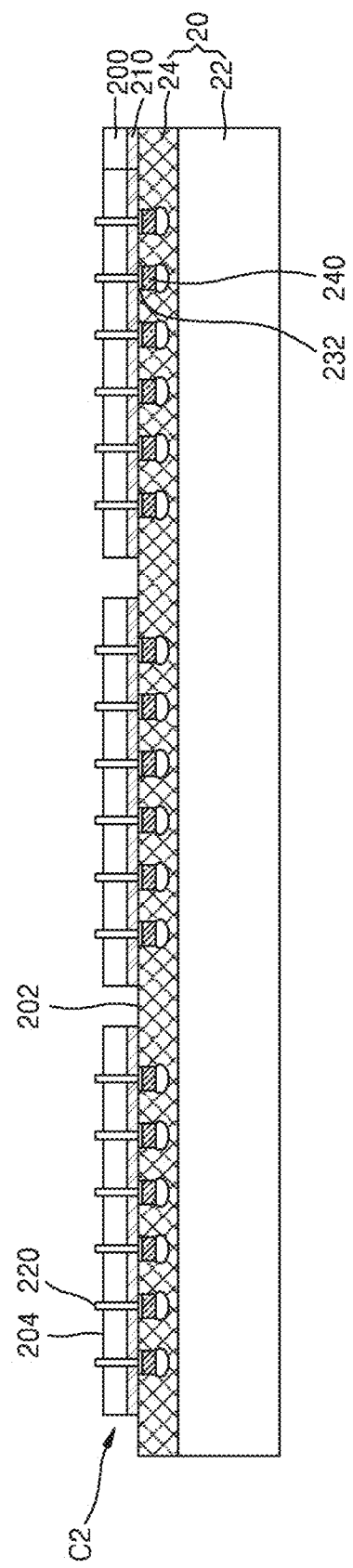

Referring to FIG. 17, the second semiconductor chip C2 is prepared. The second semiconductor chip C2 may be prepared by processing a second semiconductor wafer (not shown) and then separating the second semiconductor wafer, like in the first semiconductor wafer W1 of FIGS. 11 through 14.

The second semiconductor wafer may be a semiconductor wafer that includes the same individual devices, which are formed by using the same process as that in the first semiconductor wafer W1, as those of the first semiconductor wafer W1. That is, a plurality of the second semiconductor chips C2 that are connected together may be attached as the second semiconductor wafer to a second carrier substrate 20 and then may be cut separately into the second semiconductor chips C2. Each of the second semiconductor chip C2 includes the second semiconductor substrate 200, the second semiconductor device layer 210, and the second through-electrode 220. The second semiconductor substrate 200 may have a second top surface 202 and a second bottom surface 204 that are opposite from each other. The second through-electrode 220 may pass through the second semiconductor substrate 200.

The second semiconductor chip C2 may be a semiconductor chip that includes the same individual devices as the individual devices of the first semiconductor chip C1. Alternatively, the second semiconductor chip C2 may be a semiconductor chip that includes individual devices that are different from the individual devices of the first semiconductor chip C1.

The second semiconductor chip C2 may include the second connection bump 240 having a structure that is different from that of the first connection bump 140. The second connection hump 240 may include the second pillar structure 242 and the second solder layer 248. The second pillar structure 242 may include a material having better high-temperature properties than a material included in the first pillar structure 142. For example, the second pillar structure 242 may include Ni or a Ni alloy. The second connection bump 240 has already been explained in detail regarding FIG. 1D.

Figure 18:
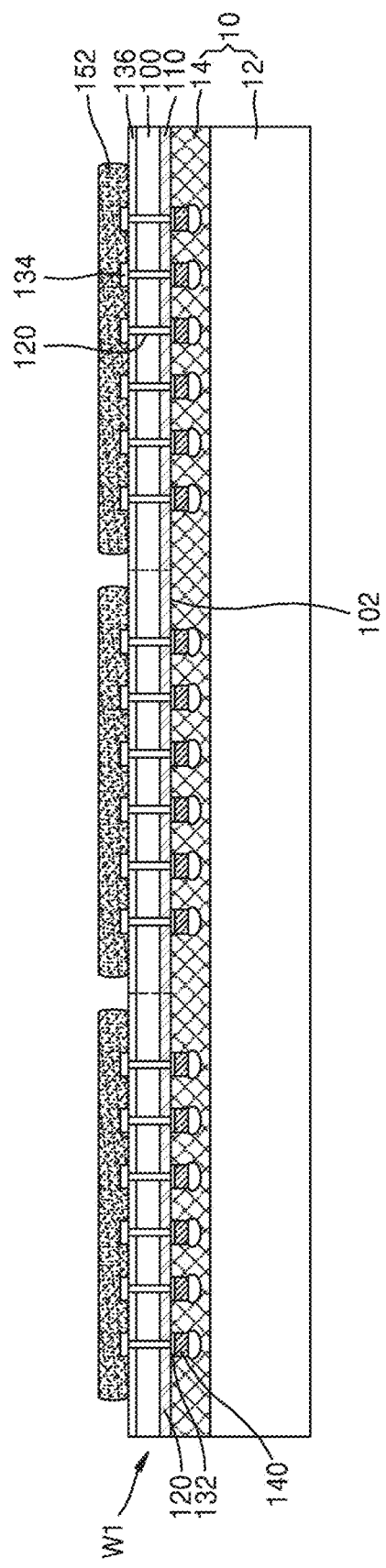

Referring to FIG. 18, the first insulating layer 152 may be attached to the first semiconductor wafer W1. The first insulating layer 152 may be disposed on the plurality of first semiconductor chips C1 to contact the first rear protective layer 136 and the first upper connection pad 134. The first insulating layer 152 may be formed from an insulating polymer.

Figure 19:
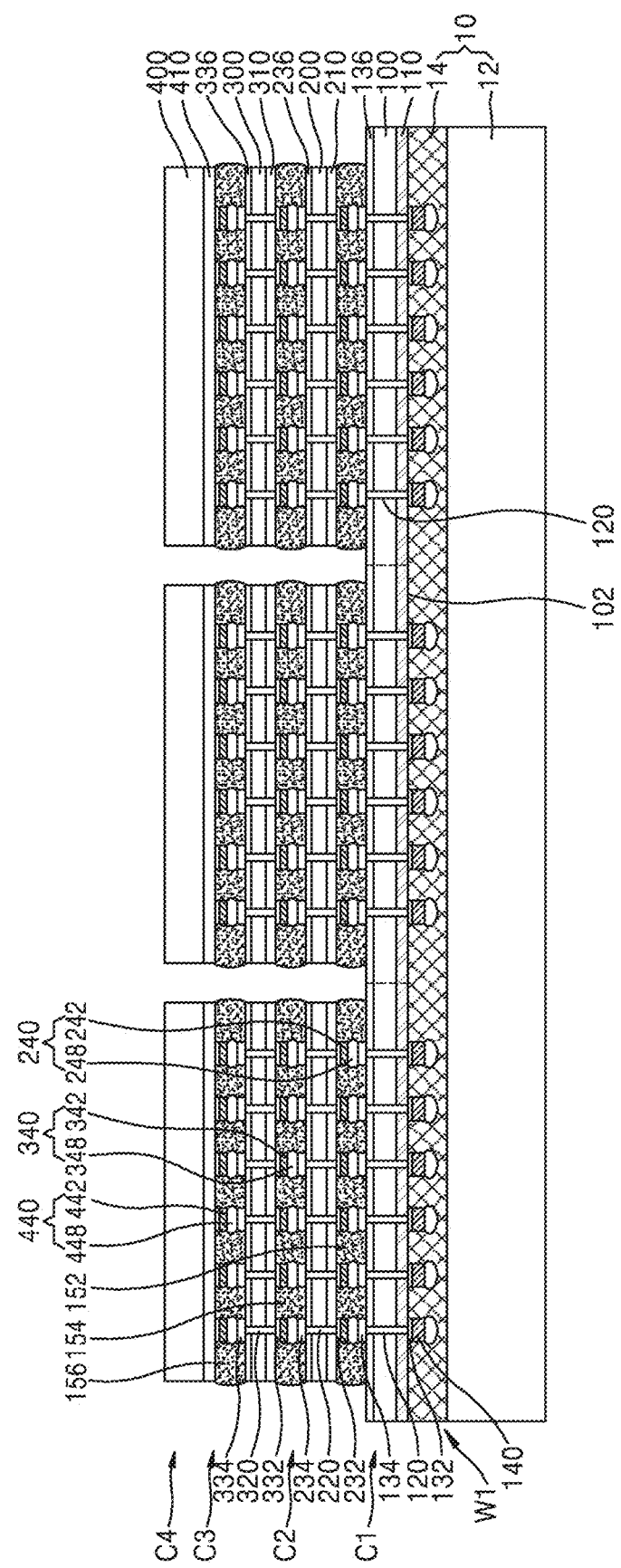

Referring to FIG. 19, the plurality of second semiconductor chips C2 are separated from the second carrier substrate 20 of FIG. 17 and are stacked on the first semiconductor wafer W1 of FIG. 18. The plurality of second semiconductor chips C2 may be stacked on the first semiconductor wafer W1 to respectively correspond to the plurality of first semiconductor chips C1 of the first semiconductor wafer W1. That is, the plurality of second semiconductor chips C2 may be stacked on the plurality of first semiconductor chips C1 to respectively correspond to the plurality of first semiconductor chips C1.

Each of the second semiconductor chip C2 may be stacked on the first semiconductor chip C1 to electrically connect the first through-electrode 120 and the second through-electrode 220. In order to electrically connect the first through-electrode 120 and the second through-electrode 220, the second semiconductor chip C2 may be stacked on the first semiconductor chip C1 so that the second connection bump 240 of the second semiconductor chip C2 contacts the first upper connection pad 134. When the first upper connection pad 134 is not formed, the second connection bump 240 may contact the first through-electrode 120. The first insulating layer 152 may be disposed between the first semiconductor chip C1 and the second semiconductor chip C2 to surround the first upper connection pad 134 and the second connection bump 240.

After the second semiconductor chip C2 is stacked on the first semiconductor chip C1, an adhesive force between the second connection bump 240 and the first upper connection pad 134 or between the second connection bump 240 and the first through-electrode 120 may be increased by performing a reflow process or a thermal compression process, and a contact resistance may be reduced.

Next, the second insulating layer 154 is disposed on the plurality of second semiconductor chips C2 and the plurality of third semiconductor chips C3 are stacked on the first semiconductor wafer W1 to respectively correspond to the plurality of second semiconductor chips C2 by repeatedly performing processes of FIGS. 17 through 19. The third insulating layer 156 is disposed on the plurality of third semiconductor chips C3 and the plurality of fourth semiconductor chips C4 are stacked on the first semiconductor wafer W1 to respectively correspond to the plurality of third semiconductor chips C3. The third and fourth semiconductor chips C3 and C4 may be semiconductor chips including the same individual devices as the individual devices of the first semiconductor chip C1. Alternatively, the third and fourths semiconductor chips C3 and C4 may be semiconductor chips including individual devices that are different from the individual devices of the first semiconductor chip C1.

A reflow process or a thermal compression process may be performed after the third semiconductor chips C3 are stacked on the second semiconductor chips C2, or a reflow process or a thermal compression process may be performed after the fourth semiconductor chips C4 are stacked on the third semiconductor chips C3.

Although a stacked structure in which the second through fourth semiconductor chips C2, C3, and C4 are stacked on the first semiconductor wafer W1 in the vertical direction is illustrated in FIG. 19, the number of semiconductor chips stacked on the first semiconductor wafer W1 is not limited thereto.

In some embodiments, a first underfill layer (not shown), instead of the first insulating layer 152, may be formed between the first semiconductor chip C1 and the second semiconductor chip C2. The first underfill layer may be formed from epoxy resin by using, for example, a capillary underfill method. The first underfill layer may be combined with a filler, and the filler may be formed from, for example, silica.

Figure 20:
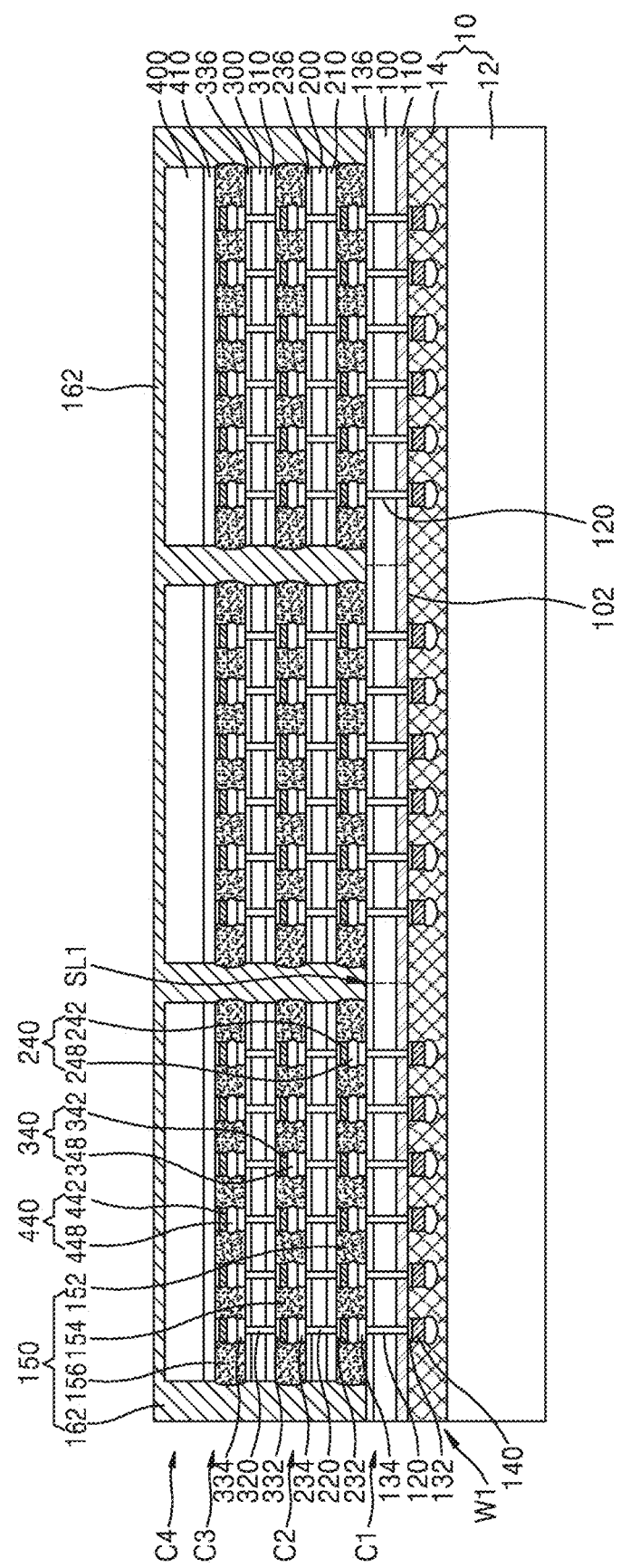

Referring to FIG. 20, the first mold layer 162 that covers the second through fourth semiconductor chips C2, C3, and C4 is formed on the first semiconductor wafer W1, The first mold layer 162 may be formed to cover side surfaces of the second and third semiconductor chips C2 and C3 and a side surface and a top surface of the fourth semiconductor chip C4. Since the first through third insulating layers 152, 154, and 156 are disposed between the first through fourth semiconductor chips C1, C2, C3, and C4, the first mold layer 162 may surround side surfaces of the first through third insulating layers 152, 154, and 156. In some embodiments, the first mold layer 162 may be formed from an EMC.

Figure 21:
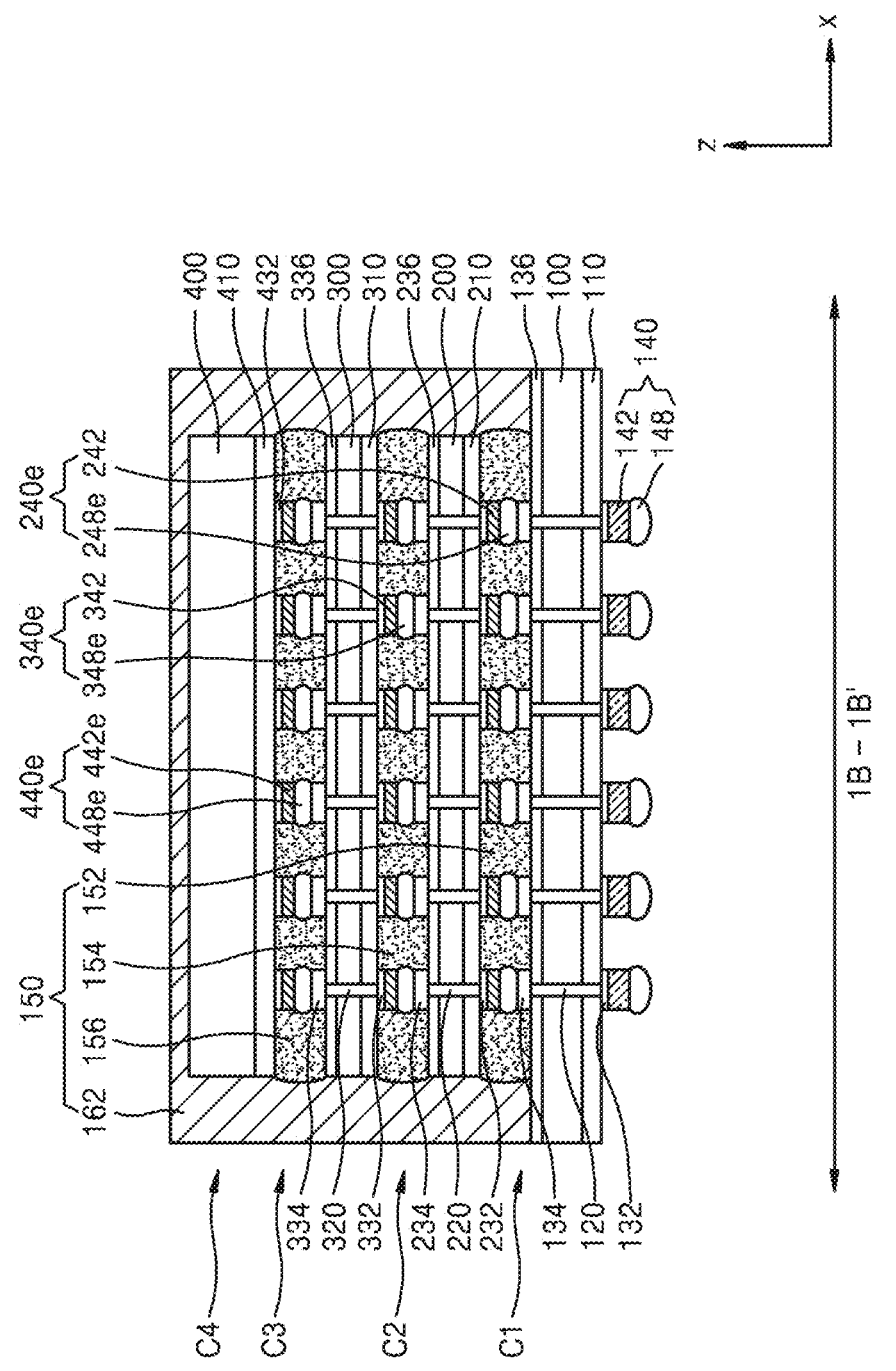

Referring to FIG. 21, the first semiconductor wafer W1 may be cut along the first scribe lanes SL1 (see FIG. 20) into the semiconductor packages 1 each including the first through fourth semiconductor chips C1, C2, C3, and C4.

Each semiconductor package 1 may include the first semiconductor chip C including the first through-electrode 120, the second semiconductor chip C2 that is stacked on the first semiconductor chip C1 with the first insulating layer 152 therebetween and includes the second through-electrode 220, the third semiconductor chip C3 that is stacked on the second semiconductor chip C2 with the second insulating layer 154 therebetween and includes the third through-electrode 320, and the fourth semiconductor chip C4 that is stacked on the third semiconductor chip C3 with the third insulating layer 156 therebetween.

A horizontal cross-sectional area of each of the second through fourth semiconductor chips C2, C3, and C4 may be smaller than a horizontal cross-sectional area of the first semiconductor chip C1. The first mold layer 162 may be formed on a portion of the first semiconductor chip C1 to surround the side surfaces of the second through fourth semiconductor chips C2, C3, and C4. Since the first mold layer 162 is formed on a portion of the first semiconductor chip C1 to surround the side surfaces of the second through fourths semiconductor chips C2, C3, and C4, the first connection bump 140 that is disposed on a bottom surface of the first semiconductor chip C1 may not contact the first mold layer 162.

According to the method of manufacturing the semiconductor package 1, the second through fourth semiconductor chips C2, C3, and C4 are sequentially stacked on the first semiconductor wafer W1, and a process of thermally compressing or reflowing the second through fourth semiconductor chips C2, C3, and C4 is repeatedly performed a plurality of times. Accordingly, a plurality of high-temperature processes may be performed on the second through fourth connection bumps 240, 340, and 440 that are disposed between the first through fourth semiconductor chips C1, C2, C3, and C4.

In general, when a semiconductor package is exposed to a high-temperature environment, an intermetallic compound may be formed between a solder layer of a connection bump and a connection pad or between a pillar layer of the connection bump and the solder layer, and an excessive amount of intermetallic compounds may be formed in a plurality of high-temperature processes. For example, when an excessive amount of intermetallic compounds are formed, the solder layer may be consumed and a void may be formed in the solder layer. Also, since the intermetallic compounds have a high brittleness, a crack may be easily formed in the intermetallic compounds due to a mechanical impact from the outside of the semiconductor package. Accordingly, when an excessive amount of intermetallic compounds is formed, the reliability of the semiconductor package may be reduced.

However, according to the semiconductor package 1, since each of the second through fourth pillar structures 242, 342, and 442 of the second through fourth connection bumps 240, 340, and 440 that are inter-chips connection bumps includes a material having relatively good high-temperature properties, even when a plurality of high-temperature processes are performed, an excessive amount of intermetallic compounds may be prevented from being formed.

Also, the first pillar structure 142 of the first connection bump 140 that is a substrate-chip connection bump may be mounted on an underlying substrate (not shown) or an interposer (not shown). Warpage may easily occur in the underlying substrate or the interposer in a reflow process or a molding process. The first pillar structure 142 may include a material having a Young's modulus that is lower than that of a material included in the second pillar structure 242. Accordingly, even when warpage occurs in the underlying substrate or the interposer, since the first pillar structure 142 has a relatively large elasticity, a crack may be prevented from being formed in an interface between the first pillar layer 144 and the first solder layer 148.

In conclusion, since each of the second through fourth connection bumps 240, 340, and 440 that are inter-chips connection bumps includes a material having excellent high-temperature properties, a void may be prevented from being formed in a plurality of high-temperature processes. Since the first connection bump 140 that is a substrate-chip connection bump includes a material having a low Young's modulus, even when warpage occurs in an underlying substrate or an interposer, excellent adhesion properties may be ensured. Accordingly, the semiconductor package 1 may have high adhesion reliability.

While the inventive concept has been particularly shown and described regarding embodiments thereof, it will be understood that various changes in form and details may be made therein without departing from the scope of the following claims.

What is claimed is:
1. A semiconductor package comprising:
   a first semiconductor chip including,
      a plurality of first through-electrodes,
      a plurality of first top contact pads being respectively connected to the plurality of first through-electrodes, and
      a plurality of first bottom contact pads being respectively connected to the plurality of first through-electrodes;
   a plurality of second semiconductor chips stacked on a top surface of the first semiconductor chip;
   a plurality of first connection bumps on a bottom surface opposing the top surface of the first semiconductor chip, each of the plurality of first connection bumps including,
      a first solder layer on a substrate,
      a first diffusion barrier layer comprising nickel (Ni) and being on the first solder layer, and
      a first pillar layer comprising copper (Cu), being on the first diffusion barrier layer, and contacting a first bottom contact pad of the plurality of first bottom contact pads; and
   a plurality of second connection bumps between the top surface of the first semiconductor chip and a lowermost second semiconductor chip of the plurality of second semiconductor chips, the lowermost second semiconductor chip including,
      a plurality of second through-electrodes, and
      a plurality of second bottom contact pads being respectively connected to the plurality of second through-electrodes,
   wherein each of the plurality of second connection bumps includes,
      a second solder layer on a first top contact pad of the plurality of first top contact pads of the first semiconductor chip, and
      a second pillar structure on the second solder layer and contacting a second bottom contact pad of the plurality of second bottom contact pads,
   wherein the first pillar layer has a first width in a first direction parallel to the top surface of the first semiconductor chip, the first diffusion barrier layer has a second width in the first direction, and the second width is greater than the first width, wherein the first width of the first pillar layer is in a range of 20 μm and 40 μm and the second width of the first diffusion barrier layer is in a range of 20 μm and 45 μm, and wherein a first height of the plurality of first connection bumps between the first bottom contact pad of the first semiconductor chip and the substrate is in a range of 15 μm and 60 μm and is greater than a second height of the plurality of second connection bumps between the first top contact pad of the first semiconductor chip and the second bottom contact pad of the lowermost second semiconductor chip, the first height and the second height being measured in a second direction perpendicular to the first direction.

2. The semiconductor package of claim 1, wherein a first distance between the first bottom contact pad of the first semiconductor chip and the substrate is in a range of 15 μm and 60 μm, and is greater than a second distance between the first top contact pad of the first semiconductor chip and the second bottom contact pad of the lowermost second semiconductor chip.

3. The semiconductor package of claim 1, wherein the plurality of second connection bumps are between two adjacent second semiconductor chips amongst the plurality of second semiconductor chips.

4. The semiconductor package of claim 1, wherein the second pillar structure comprises Cu.

5. The semiconductor package of claim 1, wherein a first through-electrode of the plurality of first through-electrodes is connected to one of the plurality of first connection bumps and to one of the plurality of second connection bumps.

6. The semiconductor package of claim 1, further comprising:
a first molding member surrounding side surfaces of the plurality of second semiconductor chips and the plurality of second connection bumps, the first molding member being not in contact with the bottom surface of the first semiconductor chip or the plurality of first connection bumps.

7. The semiconductor package of claim 1, wherein
the substrate is electrically connected to the first semiconductor chip through the plurality of first connection bumps,
the substrate includes an external connection terminal on a bottom surface of the substrate opposite to a top surface of the substrate that faces the first semiconductor chip, and
a width of the external connection terminal in the first direction is larger than that of each of the first solder layer and the second solder layer.

8. The semiconductor package of claim 7, wherein
the substrate is an interposer or a printed circuit board (PCB), and
the width of the external connection terminal in the first direction is greater than 50 μm.

9. A semiconductor package comprising:
a substrate;
a first semiconductor chip on the substrate, the first semiconductor chip including,
at least one first through-electrode,
at least one first top contact pad on a top surface of the first semiconductor chip and connected to the at least one first through-electrode, and
at least one first bottom contact pad on a bottom surface of the first semiconductor chip and connected to the at least one first through-electrode;
a plurality of second semiconductor chips on the first semiconductor chip;
a plurality of first connection bumps between the substrate and the first semiconductor chip, each of the plurality of first connection bumps including,
a first solder layer on the substrate,
a first diffusion barrier layer on the first solder layer, and
a first pillar layer on the first diffusion barrier layer and contacting the at least one first bottom contact pad; and
a plurality of second connection bumps between the first semiconductor chip and a lowermost second semiconductor chip of the plurality of second semiconductor chips, the lowermost second semiconductor chip including,
at least one second through-electrode, and
at least one second bottom contact pad on a bottom surface of the lowermost second semiconductor chip and connected to the at least one second through-electrode,
wherein each of the plurality of second connection bumps includes,
a second solder layer on the at least one first top contact pad of the first semiconductor chip, and
a second pillar structure on the second solder layer and contacting the at least one second bottom contact pad,
wherein a first height of the plurality of first connection bumps between the at least one first bottom contact pad of the first semiconductor chip and the substrate is in a range of 15 μm and 60 μm and is greater than a second height of the plurality of second connection bumps between the at least one first top contact pad of the first semiconductor chip and the at least one second bottom contact pad of the lowermost second semiconductor chip, the first and second heights being measured in an extending direction of the at least one first and second through-electrodes, and
wherein the first pillar layer has a first width in a first direction parallel to the top surface of the first semiconductor chip, the first diffusion barrier layer has a second width in the first direction, and the second width is greater than the first width.

10. The semiconductor package of claim 9, wherein the extending direction is perpendicular to the first direction.

11. The semiconductor package of claim 10, wherein
the substrate is electrically connected to the first semiconductor chip through the plurality of first connection bumps,
the substrate includes an external connection terminal on a bottom surface of the substrate opposite to a top surface of the substrate that faces the first semiconductor chip,
a width of the external connection terminal in the first direction is larger than that of each of the first solder layer and the second solder layer, and
the width of the external connection terminal in the first direction is greater than 50 μm.

12. The semiconductor package claim 9, wherein
the first width of the first pillar layer is in a range of 20 μm and 40 μm and the second width of the first diffusion barrier layer is in a range of 20 μm and 45 μm, and the first width is in a range of 80% to 95% of the second width.

13. The semiconductor package of claim 9, wherein a first distance between the at least one first bottom contact pad of the first semiconductor chip and the substrate is in a range of 15 μm and 60 μm, and is greater than a second distance between the at least one first top contact pad of the first semiconductor chip and the at least one second bottom contact pad of the lowermost second semiconductor chip.

14. The semiconductor package of claim 9, wherein the plurality of second connection bumps are between two adjacent second semiconductor chips amongst the plurality of second semiconductor chips.

15. The semiconductor package of claim 9, wherein the first pillar layer comprises copper (Cu) and the first diffusion barrier layer comprises nickel (Ni).

16. A semiconductor package comprising:
    a first semiconductor chip including,
    a plurality of first through-electrodes,
    a plurality of first top contact pads being respectively connected to the plurality of first through-electrodes; and
    a plurality of first bottom contact pads being respectively connected to the plurality of first through-electrodes;
    a plurality of second semiconductor chips stacked on a top surface of the first semiconductor chip;
    a plurality of first connection bumps on a bottom surface opposing the top surface of the first semiconductor chip, each of the plurality of first connection bumps including,
        a first solder layer on a substrate,
        a first diffusion barrier layer comprising nickel (Ni), and being on the first solder layer, and
        a first pillar layer comprising copper (Cu), and being on the first diffusion barrier layer and contacting a first bottom contact pad of the plurality of first bottom contact pads; and
    a plurality of second connection bumps between the top surface of the first semiconductor chip and a lowermost second semiconductor chip of the plurality of second semiconductor chips, the lowermost second semiconductor chip including,
        a plurality of second through-electrodes, and
        a plurality of second bottom contact pads being respectively connected to the plurality of second through-electrodes,
    wherein each of the plurality of second connection bumps includes,
        a second solder layer on a first top contact pad of the plurality of first top contact pads of the first semiconductor chip, and
        a second pillar structure on the second solder layer and contacting a second bottom contact pad of the plurality of second bottom contact pads,
    wherein the first pillar layer has a first width in a first direction parallel to the top surface of the first semiconductor chip, the first diffusion barrier layer has a second width in the first direction, and the second width is greater than the first width,
    wherein the first width of the first pillar layer is in a range of 20 μm and 40 μm and the second width of the first diffusion barrier layer is in a range of 20 μm and 45 μm, and
    wherein the first width is in a range of 80% to 95% of the second width.

17. The semiconductor package of claim 16, wherein a first height of the plurality of first connection bumps between the first bottom contact pad of the first semiconductor chip and the substrate is in a range of 15 μm and 60 μm, and is greater than a second height of the plurality of second connection bumps between the first top contact pad of the first semiconductor chip and the second bottom contact pad of the lowermost second semiconductor chip, the first height and the second height being measured in a second direction perpendicular to the first direction.

18. The semiconductor package of claim 16, further comprising:
    a first molding member surrounding side surfaces of the plurality of second semiconductor chips and the plurality of second connection bumps, the first molding member being not in contact with the bottom surface of the first semiconductor chip or the plurality of first connection bumps.

19. The semiconductor package of claim 16, wherein
    the substrate is electrically connected to the first semiconductor chip through the plurality of first connection bumps,
    the substrate includes an external connection terminal on a bottom surface of the substrate opposite to a top surface of the substrate that faces the first semiconductor chip, and
    a width of the external connection terminal in the first direction is larger than that of each of the first solder layer and the second solder layer.

20. The semiconductor package of claim 19, wherein
    the substrate is an interposer or a printed circuit board (PCB), and
    the width of the external connection terminal in the first direction is greater than 50 μm.

* * * * *